US012608305B2

(12) United States Patent
Shin et al.

(10) Patent No.: US 12,608,305 B2
(45) Date of Patent: Apr. 21, 2026

(54) STORAGE CONTROLLER ADJUSTING READ VOLTAGE LEVEL, STORAGE DEVICE INCLUDING THE SAME, AND METHOD OF OPERATING THE SAME

(71) Applicant: SAMSUNG ELECTRONICS CO., LTD., Suwon-si (KR)

(72) Inventors: Hyunwook Shin, Suwon-si (KR); Heesung Kim, Suwon-si (KR); Hee-Tai Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/809,782

(22) Filed: Aug. 20, 2024

(65) Prior Publication Data

US 2025/0284627 A1 Sep. 11, 2025

(30) Foreign Application Priority Data

Mar. 6, 2024 (KR) ........................ 10-2024-0031700

(51) Int. Cl.
| | |
|---|---|
| *G06F 12/00* | (2006.01) |
| *G06F 12/02* | (2006.01) |
| *G11C 7/10* | (2006.01) |

(52) U.S. Cl.
CPC ........ G06F 12/0223 (2013.01); *G11C 7/1051* (2013.01)

(58) Field of Classification Search
CPC .......................... G06F 12/0223; G11C 7/1051
See application file for complete search history.

(56) References Cited

U.S. PATENT DOCUMENTS

| | | | | |
|---|---|---|---|---|
| 10,514,863 | B2 | 12/2019 | Lee | |
| 10,614,897 | B1 | 4/2020 | Steiner | |
| 11,017,837 | B2 | 5/2021 | Hashimoto | |
| 11,189,350 | B2 | 11/2021 | Jeon | |
| 2018/0173432 | A1* | 6/2018 | Han | G06F 3/0634 |
| 2021/0335438 | A1* | 10/2021 | Troia | G06F 13/28 |
| 2022/0129199 | A1 | 4/2022 | Song et al. | |
| 2022/0165314 | A1* | 5/2022 | Kang | G11C 29/022 |
| 2022/0300200 | A1* | 9/2022 | Yeh | G11C 7/04 |
| 2022/0300409 | A1 | 9/2022 | Duan et al. | |

(Continued)

FOREIGN PATENT DOCUMENTS

| | | | | | |
|---|---|---|---|---|---|
| CN | 119322757 A | * | 1/2025 | ......... | G06F 12/0862 |
| JP | 2021-39810 A | | 3/2021 | | |

(Continued)

*Primary Examiner* — Shawn X Gu
*Assistant Examiner* — Mohammad S Hasan
(74) *Attorney, Agent, or Firm* — Sughrue Mion, PLLC

(57) ABSTRACT

A method of operating a storage controller which communicates with a non-volatile memory device, is provided. The method includes: providing a first request to the non-volatile memory device for a first sequential read operation of first data, wherein the first request indicates a row address and a column address of the first data; determining to adjust a read voltage level for reading second data stored sequential to the first data; generating offset information for adjusting the read voltage level; and providing a second request to the non-volatile memory device for a second sequential read operation of the second data to the non-volatile memory device, wherein the second request indicates the offset information.

20 Claims, 14 Drawing Sheets

(56)　　　　　　References Cited

U.S. PATENT DOCUMENTS

| 2023/0015496 | A1 | 1/2023 | Oh et al. |
| 2023/0266917 | A1 | 8/2023 | Choe et al. |

FOREIGN PATENT DOCUMENTS

| KR | 20090117172 A | * | 11/2009 | ............. G11C 16/26 |
| KR | 10-2018-0014994 A | | 2/2018 | |
| KR | 10-2019-0113436 A | | 10/2019 | |
| KR | 10-2022-0056906 A | | 5/2022 | |
| KR | 10-2023-0011753 A | | 1/2023 | |
| KR | 10-2023-0126342 A | | 8/2023 | |

* cited by examiner

| Type | Operation Description | Command Overhead | Read Voltage Level Adjustment |
|---|---|---|---|
| TY1 | Random read operation (row address and column address are included) | High | Available |
| TY2 | Sequential read initiation operation | Low | – |
| TY3 | Sequential read operation (row address and column address are omitted) | Low | Unavailable |
| TY4 | Sequential read operation with a read voltage level adjustment (row address and column address are omitted) | Low | Available |
| TY5 | Sequential read termination operation | Low | – |

FIG. 6

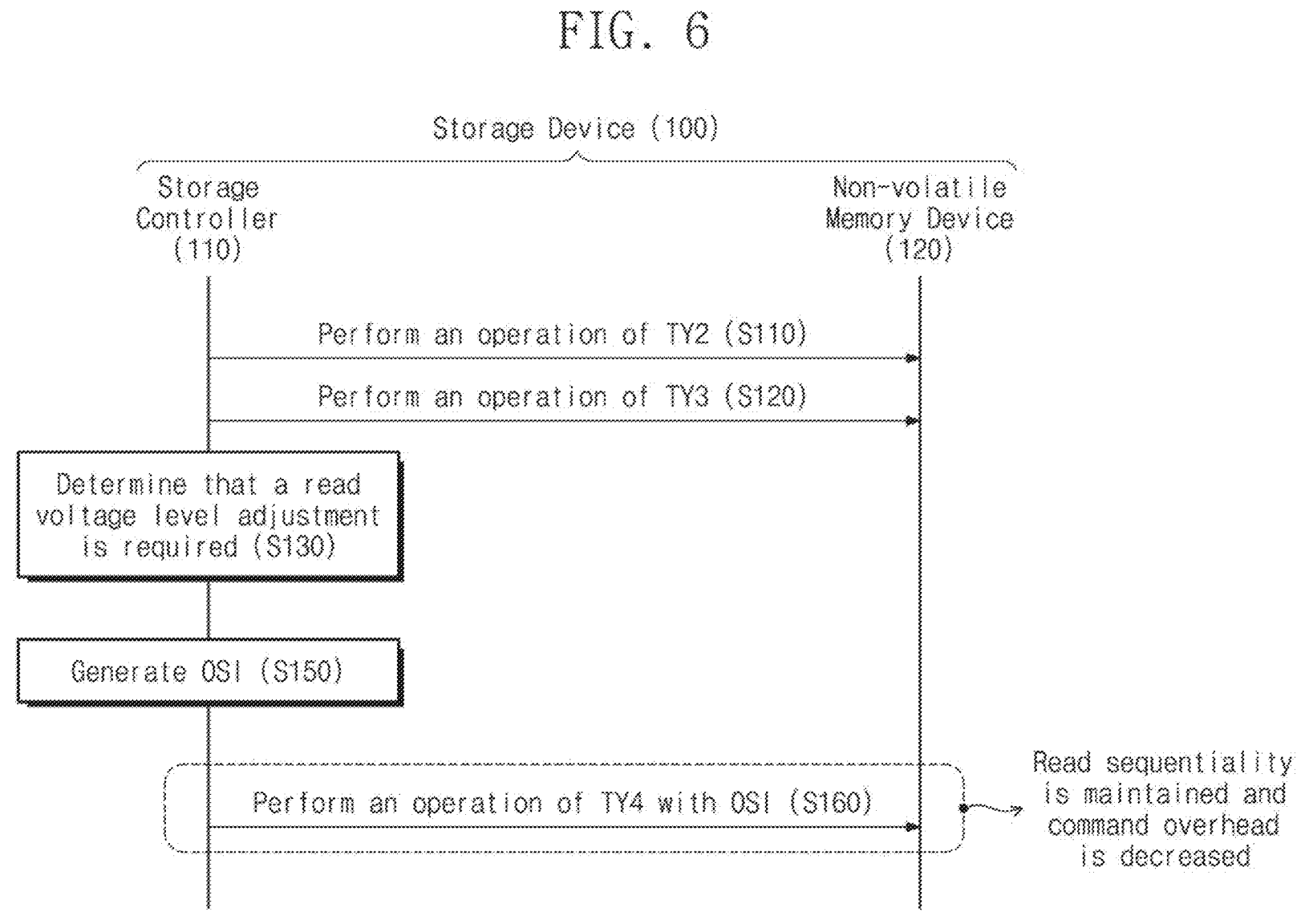

Storage Device (100)

Storage Controller (110)

Non-volatile Memory Device (120)

Perform an operation of TY2 (S110)

Perform an operation of TY3 (S120)

Determine that a read voltage level adjustment is required (S130)

Generate OSI (S150)

Perform an operation of TY4 with OSI (S160)

Read sequentiality is maintained and command overhead is decreased

FIG. 11

STORAGE CONTROLLER ADJUSTING READ VOLTAGE LEVEL, STORAGE DEVICE INCLUDING THE SAME, AND METHOD OF OPERATING THE SAME

CROSS-REFERENCE TO RELATED APPLICATION

This application claims priority under 35 U.S.C. § 119 to Korean Patent Application No. 10-2024-0031700, filed on Mar. 6, 2024, in the Korean Intellectual Property Office, the disclosure of which is incorporated by reference herein in its entirety.

BACKGROUND

The present disclosure relates to a memory device, and more particularly, to a storage controller adjusting a read voltage level, a storage device including the same, and a method of operating the same.

A memory device stores data according to a write request and outputs data stored therein according to a read request. For example, the memory device may be classified as a volatile memory device which loses data stored therein when power is turned off, such as a dynamic random access memory (DRAM) device or a static RAM (SRAM) device, or a non-volatile memory device which retains data stored therein even when power is turned off, such as a flash memory device, a phase-change RAM (PRAM), a magnetic RAM (MRAM), or a resistive RAM (RRAM).

The non-volatile memory device may be used in a storage device storing a large amount of data. The non-volatile memory device may store data by adjusting threshold voltage states of memory cells. The adjusted threshold voltage states may be changed or modified due to various factors. The change of the threshold voltage states may cause an error of data stored therein. A technique for adjusting a read voltage level may be used to maintain reliability of data stored in a storage device.

SUMMARY

One or more embodiments provide a storage controller adjusting a read voltage level, a storage device including the same, and a method of operating the same.

According to an aspect of an embodiment, a method of operating a storage controller which communicates with a non-volatile memory device, includes: providing a first request to the non-volatile memory device for a first sequential read operation of first data, wherein the first request indicates a row address and a column address of the first data; determining to adjust a read voltage level for reading second data stored sequential to the first data; generating offset information for adjusting the read voltage level; and providing a second request to the non-volatile memory device for a second sequential read operation of the second data to the non-volatile memory device, wherein the second request indicates the offset information.

According to another aspect of an embodiment, a storage controller includes: a read voltage level management circuit configured to: determine whether to adjust a read voltage level for reading second data, based on a status check operation of a non-volatile memory device sequentially storing first data and the second; and generate offset information for adjusting the read voltage level based on a determination to adjust the read voltage level for reading the second data; and a command management circuit configured to: provide a first request to the non-volatile memory device for a first sequential read operation of the first data; receive the offset information from the read voltage level management circuit; and provide a second request to the non-volatile memory device for a second sequential read operation of the second data. The first request indicates a row address and a column address of the first data, and the second request indicates the offset information.

According to another aspect of an embodiment, a storage device includes: a non-volatile memory device configured to sequentially store first data and second data; and a storage controller including: a read voltage level management circuit configured to: determine whether to adjust a read voltage level for reading the second data, based on a status check operation of the non-volatile memory device; and generate offset information for adjusting the read voltage level based on a determination to adjust the read voltage level for reading the second data; a command management circuit configured to: provide a first request to the non-volatile memory device for a first sequential read operation of the first data; receive the offset information from the read voltage level management circuit; and provide a second request to the non-volatile memory device for a second sequential read operation of the second data; and a buffer memory device configured to receive the first data and the second data from the non-volatile memory device. The first request indicates a row address and a column address of the first data, and the second request indicates the offset information.

BRIEF DESCRIPTION OF DRAWINGS

The above and other aspects and features will be more apparent from the following description of embodiments, taken in conjunction with the accompanying drawings.

FIG. 1 is a block diagram of an electronic device according to an embodiment.

FIG. 3 is a table describing read operations, according to some embodiments.

FIG. 6 is a flowchart describing a method of operating a storage device, according to some embodiments.

FIG. 11 is a block diagram of an electronic device according to some embodiments.

DETAILED DESCRIPTION

Figure 2:
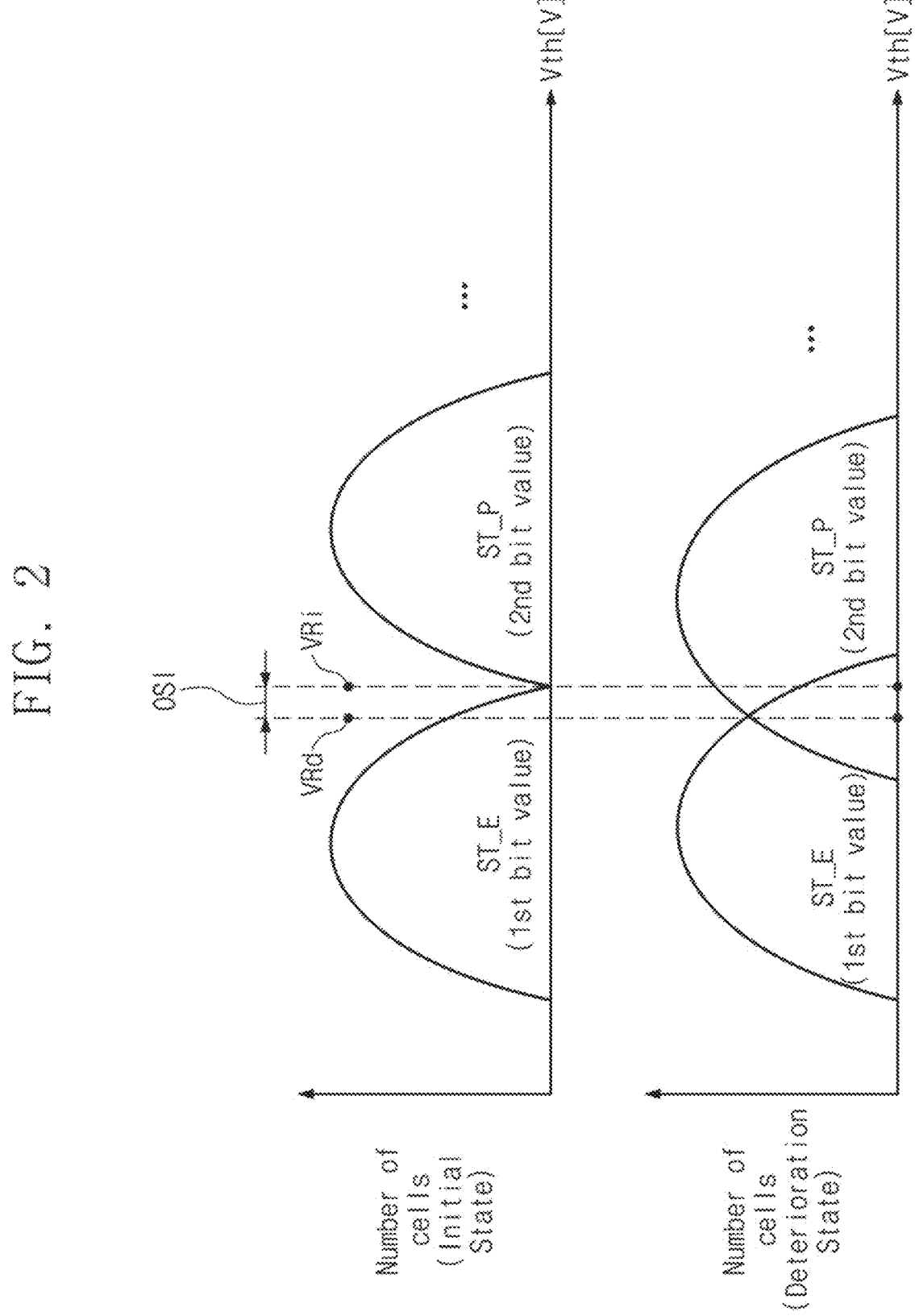
FIG. 2 is a graph describing a change in threshold voltage distributions, according to some embodiments.

Below, embodiments will be described with reference to the accompanying drawings. Like components are denoted by like reference numerals throughout the specification, and repeated descriptions thereof are omitted. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure.

Figure 1:
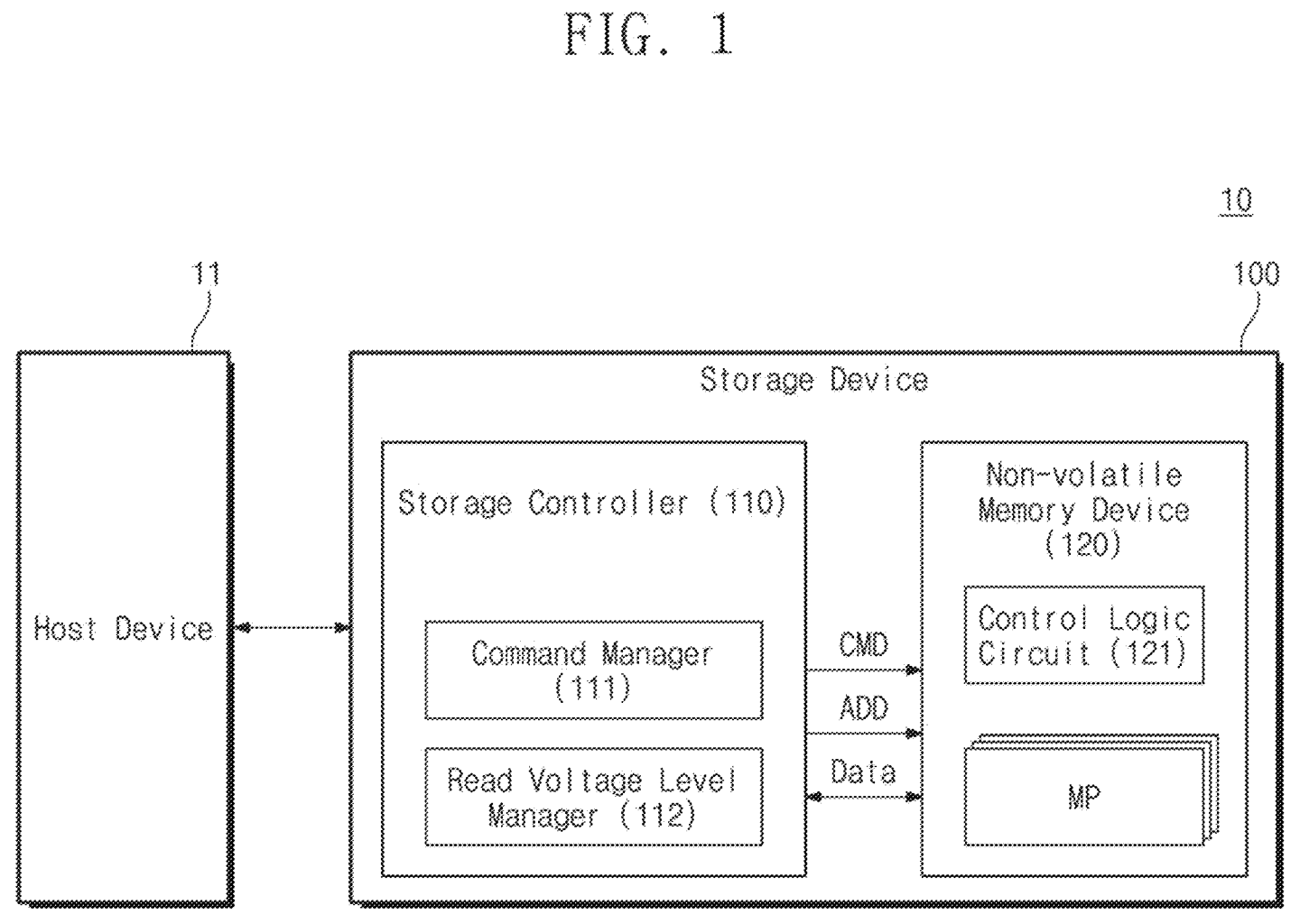

FIG. 1 is a block diagram of an electronic device according to an embodiment. Referring to FIG. 1, an electronic device 10 may include a host device 11 and a storage device 100. In some embodiments, the electronic device 10 may refer to a computing system, which is configured to process a variety of information, such as a personal computer (PC), a notebook, a laptop, a server, a workstation, a tablet PC, a smartphone, a digital camera, and a black box.

The host device 11 may control all the operations of the electronic device 10. For example, the host device 11 may store data in the storage device 100, may read data stored in the storage device 100, or may delete data stored in the storage device 100. In some embodiments, the host device 11 may sequentially store a plurality of data in the storage device 100 and may read the plurality of data stored sequentially.

The storage device 100 may include a storage controller 110 and a non-volatile memory device 120. Under control of the host device 11 or depending on an algorithm of internal firmware, the storage controller 110 may store data in the non-volatile memory device 120, may read the stored data, or may delete the stored data.

For example, based on a command CMD indicating an operation to be performed and an address ADD indicating a location of data, the storage controller 110 may store data in the non-volatile memory device 120 or may read data stored in the non-volatile memory device 120.

The storage controller 110 may include a command manager (e.g., a command management circuit) 111 and a read voltage level manager (e.g., a read level management circuit) 112. Depending on the communication with the host device 11 or the algorithm of the internal firmware, the command manager 111 may generate the command CMD and the address ADD, and may provide the command CMD and the address ADD to the non-volatile memory device 120. Depending on a location of the stored data, the command manager 111 may perform a random read operation or a sequential read operation. The sequential read operation may be referred to as a "sequential cache read operation". The sequential cache read operation may refer to an operation of sequentially transmitting a plurality of data stored in the storage device 100 to a cache memory of the host device 11. The read operations will be described in detail with reference to FIG. 3.

The read voltage level manager 112 may perform a status check operation of the non-volatile memory device 120. The status check operation may refer to an operation of obtaining distribution information of the memory cells of the non-volatile memory device 120. The distribution information may indicate the tendency of threshold voltage distributions corresponding to the data stored in the memory cells. The distribution information may be used to adjust a read voltage level in the non-volatile memory device 120. The read voltage level manager 112 may determine whether the adjustment of the read voltage level is required, based on the distribution information. Based on a determination the adjustment of the read voltage level is required, the read voltage level manager 112 may provide the command manager 111 with offset information for adjusting the read voltage level. The offset information will be described in detail with reference to FIG. 2.

Under control of the storage controller 110, the non-volatile memory device 120 may store data, may output the stored data, or may erase the stored data. In some embodiments, the non-volatile memory device 120 may be a NAND (Not AND) flash memory device, but example embodiments are not limited thereto. For example, the non-volatile memory device 120 may be one of various storage devices, which retain data stored therein even when power is turned off, such as a phase-change random access memory (PRAM), a magnetic random access memory (MRAM), a resistive random access memory (RRAM), and a ferroelectric random access memory (FRAM).

The non-volatile memory device 120 may include a control logic circuit 121 and a plurality of memory planes MP. The control logic circuit 121 may store data in the plurality of memory planes MP based on the command CMD and the address ADD. Each of the plurality of memory planes MP may include a plurality of memory cells arranged in a row direction and a column direction. The control logic circuit 121 may store data in the memory cells by adjusting threshold voltage levels of the memory cells.

FIG. 2 is a graph describing a change in threshold voltage distributions, according to some embodiments. A threshold voltage distribution of memory cells of an initial state and a threshold voltage distribution of a deterioration state will be described with reference to FIG. 2.

Referring to the graph of the initial state, the horizontal axis represents a threshold voltage level, and the vertical axis represents the number of memory cells. The initial state may correspond to a state which is formed at a point in time when data are initially stored in memory cells or immediately after the data are stored. A memory cell may include a floating gate. The control logic circuit 121 of FIG. 1 may adjust the amount of electrons trapped by the floating gate of the memory cell. The threshold voltage level of the memory cell may vary depending on the amount of electrons trapped by the floating gate. The adjusted threshold voltage level may correspond to data stored in the memory cell.

In some examples, some of the memory cells may be programmed to an erase state ST_E. The erase state ST_E may indicate data having a first bit value. The other memory cells may be programmed to a programming state ST_P. The programming state ST_P may indicate data having a second bit value. When a memory cell is implemented with a multi-level cell storing two or more bits, other programming states may further exist.

A default read voltage level VRi of the initial state may be used to distinguish memory cells of the erase state ST_E from memory cells of the programming state ST_P in the initial state. The memory cells of the erase state ST_E may be turned on based on a voltage with the default read voltage level VRi. The memory cells of the programming state ST_P may be turned on based on the voltage with the default read voltage level VRi.

Referring to the graph of the deterioration state, the horizontal axis represents a threshold voltage level, and the vertical axis represents the number of memory cells. The deterioration state may correspond to a state which is formed after a given time passes after data being initially stored in memory cells. A threshold voltage state of memory cells may change to be different from a threshold voltage state of the initial state. For example, the threshold voltage state may change due to various factors such as retention, a read operation of an adjacent word line, hot carrier injection (HCI), an external environment, and disturbance.

In the deterioration state, when the read operation is performed by using the default read voltage level VRi, a plurality of error bits may occur. An error bit may indicate a bit value which is determined to be different from a bit value programmed in a memory cell in the initial state. The read voltage level manager 112 of FIG. 1 may perform the status check operation (e.g., a valley search operation) of the non-volatile memory device 120 and may obtain distribution information. The read voltage level manager 112 may generate offset information OSI based on the distribution information. The offset information OSI may indicate a difference between the default read voltage level VRi of the initial state and an optimized read voltage level VRd of a point in time when the status check operation is performed (e.g., of the deterioration state). The offset information OSI may be used to obtain the optimized read voltage level VRd in the non-volatile memory device 120.

In the deterioration state, when the read operation is performed by using the optimized read voltage level VRd, the number of error bits may decrease. For example, the number of error bits detected when the stored data are read by using the offset information OSI or the optimized read voltage level VRd in the deterioration state may be less than the number of error bits detected when the stored data are read by using the default read voltage level VRi in the deterioration state. That is, the reliability of data stored in the storage device 100 of FIG. 1 may be improved by adjusting a read voltage level.

FIG. 3 is a table describing read operations, according to some embodiments. Referring to FIGS. 1 and 3, various types of operations which are performed by the command manager 111 will be described.

An operation of a first type TY1 may indicate the random read operation. The random read operation may be also referred to as a "normal read operation". The operation of the first type TY1 may be performed based on a row address and a column address of data to be read through the read operation. The row address may describe a location of data in the row direction. The column address may describe a location of data in the column direction. The operation of the first type TY1 may require a high command overhead. The command overhead may indicate the level of burden of the storage controller 110 for managing a command or an address. The operation of the first type TY1 may support read voltage level adjustment. The operation of the first type TY1 may include be performed based on information (e.g., offset information) about a read voltage level to be adjusted.

An operation of a second type TY2 may indicate a sequential read initiation operation. The sequential read initiation operation may be an operation for obtaining data stored first of all from among a plurality of data stored sequentially. The operation of the second type TY2 may require an indication of a row address and a column address of data from which the sequential read operation is to be initiated. The operation of the second type TY2 may require a low command overhead.

An operation of a third type TY3 may indicate a sequential read operation. The sequential read operation may be performed after the operation of the second type TY2 or after another sequential read operation (e.g., another operation of the third type TY3 or another operation of a fourth type TY4). The operation of the third type TY3 may be performed based on a command indicating the sequentiality of target data of the sequential read operation and data of an immediately previous operation. The operation of the third type TY3 may not require an indication of a row address and a column address of the target data. Because the command to perform the operation of the third type TY3 does not require an indication of a row address and a column address, the operation of the third type TY3 may have a low command overhead. The operation of the third type TY3 may not support read voltage level adjustment.

An operation of the fourth type TY4 may indicate a sequential read operation with read voltage level adjustment. The sequential read operation with the read voltage level adjustment may be performed after the operation of the second type TY2 or after another sequential read operation (e.g., another operation of the third type TY3 or another operation of the fourth type TY4). The operation of the fourth type TY4 may be performed based on a command indicating the sequentiality of target data of the sequential read operation, and data of an immediately previous operation. The operation of the fourth type TY4 may not require an indication of a row address and a column address of the target data. Because the operation of the fourth type TY4 does not require an indication of a row address and a column address, the operation of the fourth type TY4 may have a low command overhead. The operation of the fourth type TY4 may support read voltage level adjustment. The operation of the fourth type TY4 may be performed based on information (e.g., offset information) about a read voltage level to be adjusted.

An operation of a fifth type TY5 may indicate a sequential read termination operation. The sequential read termination operation may be an operation for obtaining data stored last from among a plurality of data stored sequentially. The operation of the fifth type TY5 may be performed based on a command indicating the sequentiality of target data of the sequential read termination operation and data of an immediately previous operation. The operation of the fifth type TY5 may not require an indication of a row address and a column address of the target data. The operation of the fifth type TY5 may have a low command overhead.

In general, as in the above description of the third type TY3, the sequential read operation may be implemented with a simple command and may be difficult to include information (e.g., offset information) for read voltage level adjustment. When the read voltage level adjustment is required, the operation of the first type TY1 may be forced.

In contrast, according to embodiments, the storage device 100 may perform the sequential read operation (i.e., the operation of the fourth type TY4) supporting read voltage level adjustment. In this case, the read voltage level may be adjusted while maintaining the sequential read operation, instead of terminating the sequential read operation and performing the random read operation to adjust the read voltage level. Accordingly, the overhead of command management may decrease, a time required to perform the read operation may decrease, and the reliability of stored data may be maintained.

Figure 4:
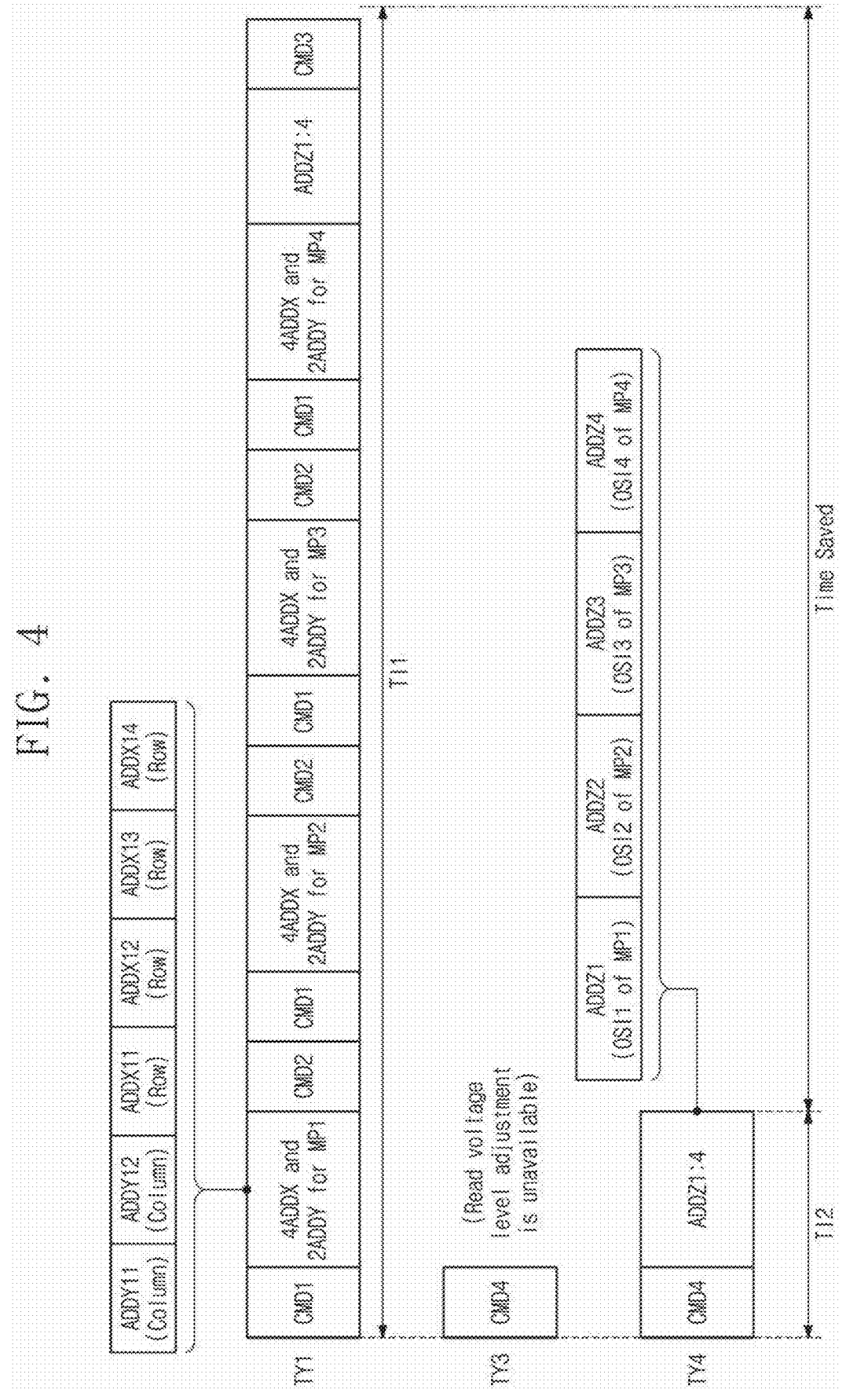
FIG. 4 is a diagram describing examples of read operations, according to some embodiments.

FIG. 4 is a diagram describing examples of read operations of FIG. 3, according to some embodiments. The operation of the first type TY1, the operation of the third type TY3, and the operation of the fourth type TY4 will be described with reference to FIGS. 3 and 4.

The operation of the first type TY1 may sequentially include a first command CMD1, addresses of a first memory plane MP1, a second command CMD2, the first command CMD1, addresses of a second memory plane MP2, the second command CMD2, the first command CMD1, addresses of a third memory plane MP3, the second command CMD2, the first command CMD1, addresses of a fourth memory plane MP4, addresses including offset information, and a third command CMD3.

The first command CMD1 may include a hexadecimal code value indicating a start of each of the first to fourth memory planes MP1 to MP4. The second command CMD2 may include a hexadecimal code value indicating an end of each of the first to fourth memory planes MP1 to MP4. The third command CMD3 may include a hexadecimal code value indicating an end of the operation of the first type TY1.

The addresses of the first memory plane MP1 may include four row addresses ADDX and two column addresses ADDY indicating a location of data of the first memory plane MP1. For example, the addresses of the first memory plane MP1 may sequentially include two column addresses ADDY11 and ADDY12 and four row addresses ADDX11, ADDX12, ADDX13, and ADDX14.

As in the above description, the addresses of the second memory plane MP2 may include four row addresses ADDX and two column addresses ADDY indicating a location of data of the second memory plane MP2. The addresses of the third memory plane MP3 may include four row addresses ADDX and two column addresses ADDY indicating a location of data of the third memory plane MP3. The addresses of the fourth memory plane MP4 may include four row addresses ADDX and two column addresses ADDY indicating a location of data of the fourth memory plane MP4.

The addresses including the offset information may include first to fourth addresses ADDZ1 to ADDZ4. The offset information may include first plane offset information OSI1 indicating a difference between a default read voltage level of an initial state and a first optimized read voltage level of the first memory plane MP1, second plane offset information OSI2 indicating a difference between the default read voltage level of the initial state and a second optimized read voltage level of the second memory plane MP2, third plane offset information OSI3 indicating a difference between the default read voltage level of the initial state and a third optimized read voltage level of the third memory plane MP3, and fourth plane offset information OSI4 indicating a difference between the default read voltage level of the initial state and a fourth optimized read voltage level of the fourth memory plane MP4.

The first to fourth plane offset information OSI1 to OSI4 may be respectively included in the first to fourth addresses ADDZ1 to ADDZ4. That is, the offset information may be recorded as address information. According to the operation of the first type TY1, a first time interval TI1 may be taken to process a command and an address.

The operation of the third type TY3 may be performed based on a fourth command CMD4. The fourth command CMD4 may include a hexadecimal code value indicating the operation of the third type TY3. Because data on which the sequential read operation is to be performed is sequential to data of an immediately previous operation, the operation of the third type TY3 may not require a separate indication of a row address and a column address. Also, because the operation of the third type TY3 does not support read voltage level adjustment, the operation of the third type TY3 may not include addresses including offset information.

The operation of the fourth type TY4 may be performed based on the fourth command CMD4 and addresses including offset information. As in the above operation of the first type TY1, the addresses including the offset information may include the first to fourth addresses ADDZ1 to ADDZ4. The offset information may be recorded as address information. Because data on which the sequential read operation is to be performed is sequential to data of an immediately previous operation, the operation of the fourth type TY4 may not separately indicate a row address and a column address.

When the non-volatile memory device 120 of FIG. 1 performs the operation of the fourth type TY4, the non-volatile memory device 120 may check the sequentiality of data based on the fourth command CMD4, may adjust read voltage levels based on the first to fourth plane offset information OSI1 to OSI4 of the first to fourth addresses ADDZ1 to ADDZ4, and may perform the sequential read operation based on the adjusted read voltage levels. That is, without performing the operation of the first type TY1, the non-volatile memory device 120 may identify a location of data and may perform the read operation based on an adjusted read voltage level.

According to the operation of the fourth type TY4, a second time interval TI2 may be taken to process a command and an address. The command overhead of the operation of the fourth type TY4 may be smaller than the command overhead of the operation of the first type TY1. Because the operation of the fourth type TY4 is simply implemented, the second time interval TI2 may be shorter than the first time interval TI1. A time corresponding to a difference between the first time interval TI1 and the second time interval TI2 may be saved.

The description regarding an operation which corresponds to four memory planes is provided as an example, and the number of memory planes corresponding to an operation may be more than or less than four. Also, offset information included in an operation may be used to adjust a read voltage level of memory planes, the number of which is more than or less than four.

As described above, according to embodiments, when read voltage level adjustment is required in the sequential read operation, the operation of the fourth type TY4 may be performed instead of the operation of the first type TY1. Accordingly, the overhead of command management may decrease, a time required to perform the read operation may decrease, and the reliability of stored data may be maintained.

Figure 5:
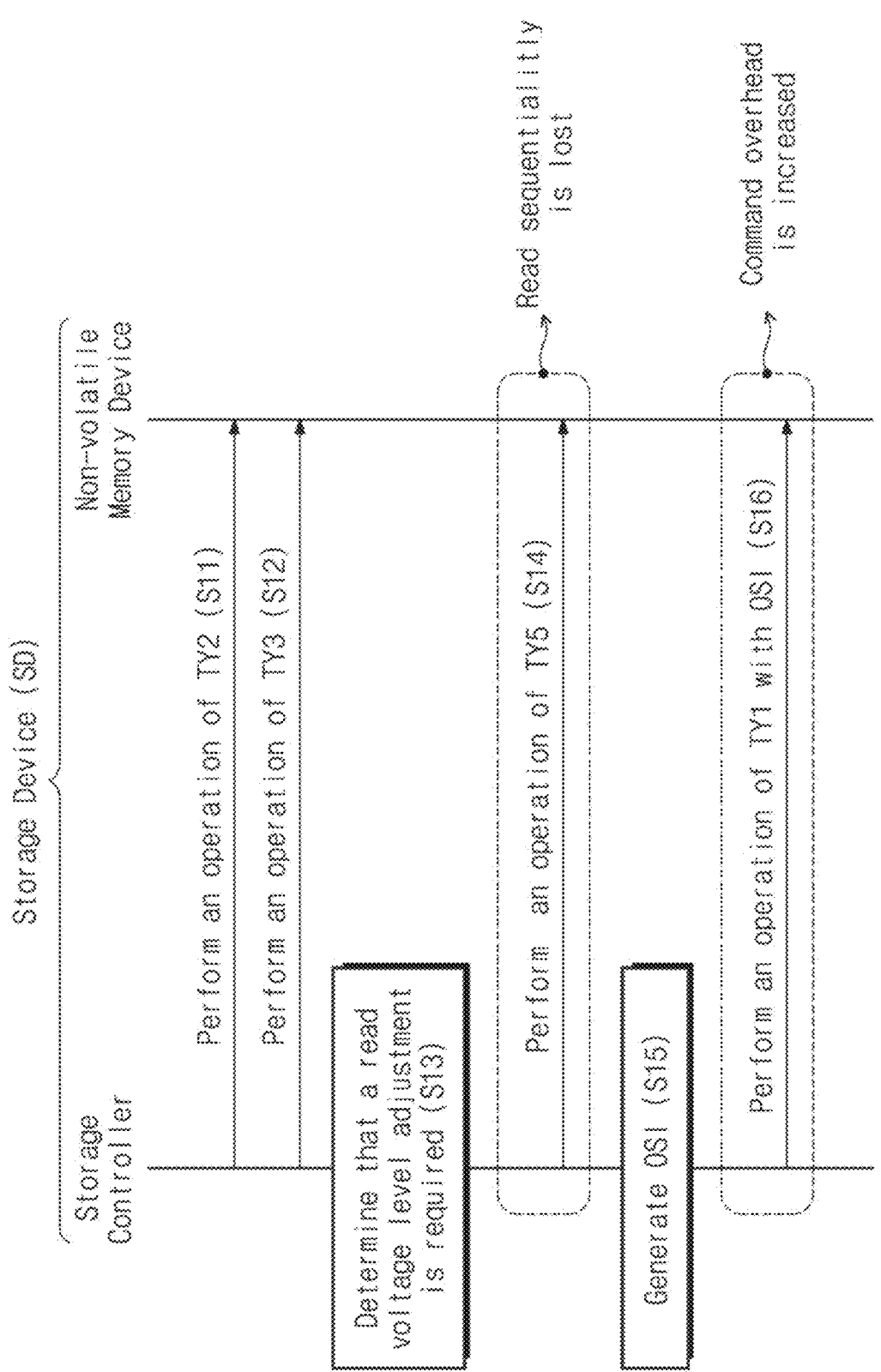
FIG. 5 is a flowchart describing a method of operating a related storage device.

FIG. 5 is a flowchart describing a method of operating a related storage device. Referring to FIGS. 3 and 5, a related storage device SD may include a storage controller and a non-volatile memory device. The related storage device SD may not support the operation of the fourth type TY4.

For better understanding, the related storage device SD will be described. The related storage device SD is not intended to limit the scope and spirit of embodiments.

In operation S11, the storage controller may perform the read operation of the second type TY2. The storage controller may read data stored first of all from among a plurality of data sequentially stored in the non-volatile memory device.

In operation S12, the storage controller may perform the read operation of the third type TY3. The storage controller may read next data sequential to the data read in operation S11 from among the plurality of data sequentially stored.

In operation S13, the storage controller may determine that read voltage level adjustment is required. Because the storage controller does not support the operation of the fourth type TY4, the operation of the first type TY1 may be forced to adjust a read voltage level.

In operation S14, the storage controller may perform the read operation of the fifth type TY5. The storage controller may terminate the sequential read operation to perform the operation of the first type TY1 subsequently. In this case, the read sequentiality may be lost. When the read sequentiality is lost, the complexity of the subsequent read operation may increase, the burden of command and address management may increase, and a time required to perform the read operation may increase.

In operation S15, the storage controller may generate the offset information OSI for adjusting the read voltage level.

In operation S16, the storage controller may perform the read operation of the first type TY1 by using the offset information OSI. The operation of the first type TY1 may be performed based on an indication of a row address and a column address describing a location of data on which the random read operation is to be performed. Because the random read operation is performed instead of the sequential read operation, the command overhead may increase.

FIG. 6 is a flowchart describing a method of operating a storage device, according to some embodiments. Referring to FIGS. 3 and 6, the storage device 100 may include the storage controller 110 and the non-volatile memory device 120. The storage device 100 may support the operation of the fourth type TY4.

In operation S110, the storage controller 110 may perform the read operation of the second type TY2. The storage controller 110 may read data stored first of all from among a plurality of data sequentially stored in the non-volatile memory device 120.

In operation S120, the storage controller 110 may perform the read operation of the third type TY3. The storage controller 110 may read next data sequential to the data read in operation S110 from among the plurality of data sequentially stored.

In operation S130, the storage controller 110 may determine that read voltage level adjustment is required. Because the storage controller 110 supports the operation of the fourth type TY4, the storage controller 110 may adjust a read voltage level through the operation of the fourth type TY4, without performing the operation of the first type TY1.

In operation S150, the storage controller 110 may generate the offset information OSI for adjusting the read voltage level.

In operation S160, the storage controller 110 may perform the operation of the fourth type TY4 by using the offset information OSI. The storage controller 110 may read next data sequential to the data read in operation S120 from among the plurality of data sequentially stored. Because the storage controller 110 provides the offset information OSI to the non-volatile memory device 120 through the operation of the fourth type TY4 instead of the operation of the first type TY1, the storage controller 110 may reduce the command overhead while maintaining the read sequentiality.

Figure 7:
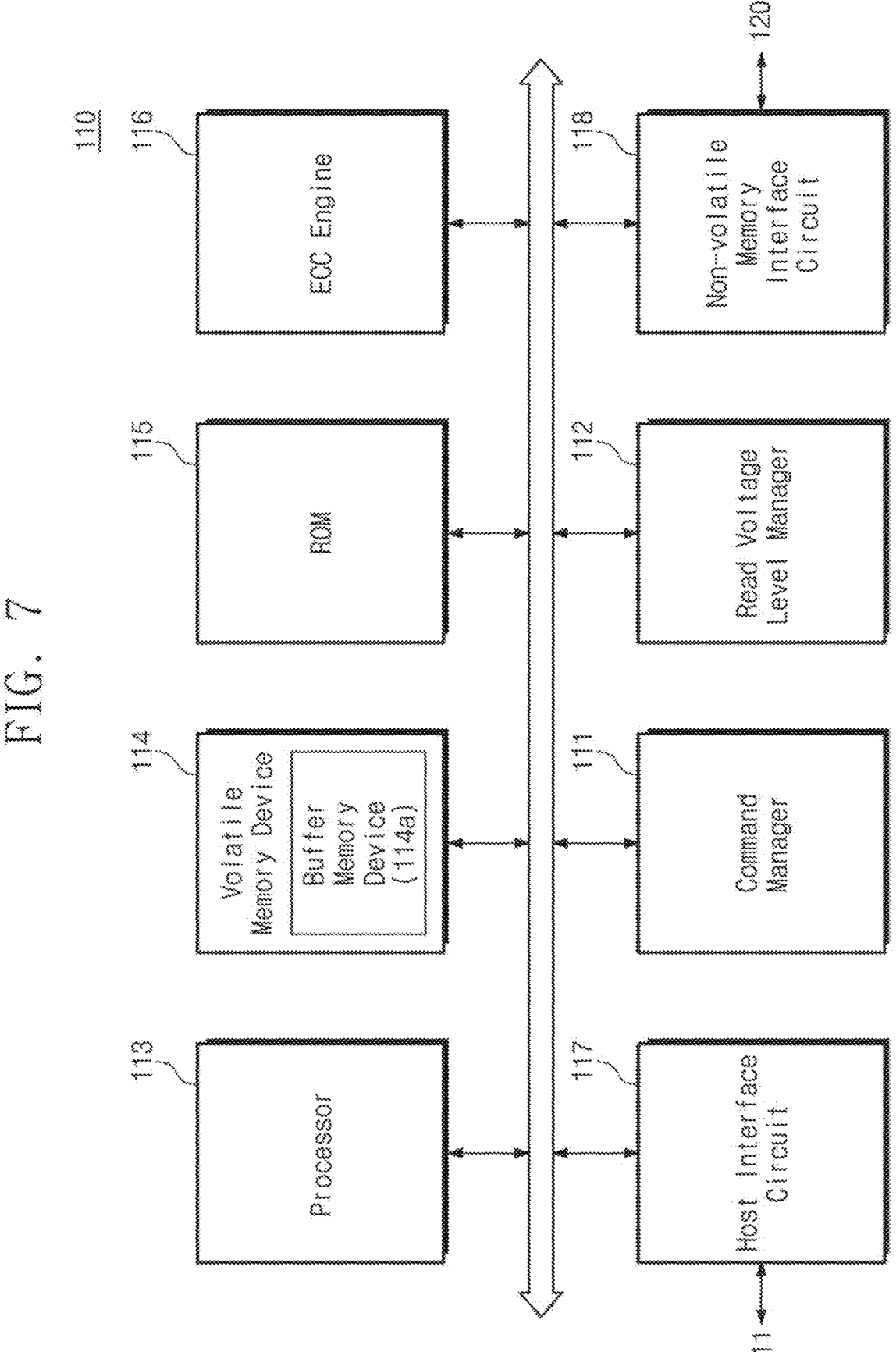
FIG. 7 is a block diagram of a storage controller according to some embodiments.

FIG. 7 is a block diagram of a storage controller according to some embodiments. Referring to FIG. 7, the storage controller 110 may communicate with the host device 11 and the non-volatile memory device 120.

The storage controller 110 may include the command manager 111, the read voltage level manager 112, a processor 113, a volatile memory device 114, a read only memory (ROM) 115, an error correcting code (ECC) engine (e.g., an ECC circuit) 116, a host interface circuit 117, and a non-volatile memory interface circuit 118.

The command manager 111 and the read voltage level manager 112 may respectively correspond to the command manager 111 and the read voltage level manager 112 of FIG. 1. The command manager 111 and the read voltage level manager 112 may be implemented using hardware which may operate according to instructions stored in a memory.

In some embodiments, at least some of the functions of the command manager 111 and the read voltage level manager 112 may be implemented with a firmware module. For example, the processor 113 may implement at least some of the functions of the command manager 111 and the read voltage level manager 112 by loading instructions stored in the non-volatile memory device 120 to the volatile memory device 114 and executing the loaded instructions.

The processor 113 may control all the operations of the storage controller 110. The volatile memory device 114 may include a buffer memory device 114a. The buffer memory device 114a may temporarily store data received from the host device 11 or may temporarily store data received from the non-volatile memory device 120. The volatile memory device 114 may be implemented with a dynamic random access memory (DRAM), a static DRAM (SRAM), etc. When a power supply is interrupted, the data stored in the volatile memory device 114 may disappear. The ROM 115 may be used as a read only memory which stores information used for the operation of the storage controller 110. The ECC engine 116 may detect and correct an error (e.g., an error bit(s)) of data received from the non-volatile memory device 120.

The storage controller 110 may communicate with the host device 11 through the host interface circuit 117. In some embodiments, the host interface circuit 117 may be implemented based on at least one of various interfaces such as a serial ATA (SATA) interface, a peripheral component interconnect express (PCIe) interface, a serial attached SCSI (SAS), a non-volatile memory express (NVMe) interface, and a universal flash storage (UFS) interface. The UFS device will be described in detail with reference to FIG. 11.

The storage controller 110 may communicate with the non-volatile memory device 120 through the non-volatile memory interface circuit 118. In some embodiments, the non-volatile memory interface circuit 118 may be implemented based on the NAND interface.

Figure 8:
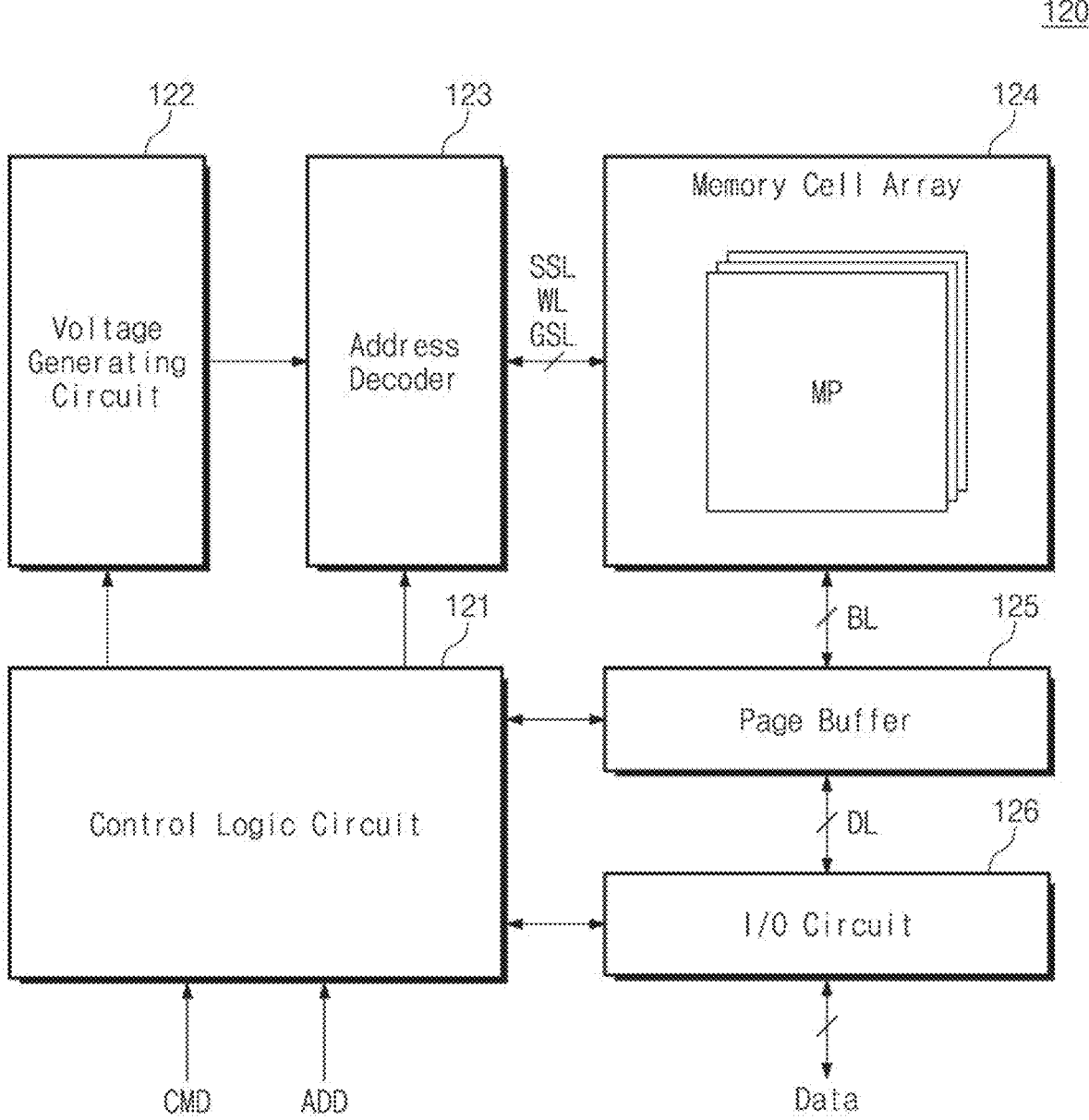
FIG. 8 is a block diagram of a non-volatile memory device according to some embodiments.

FIG. 8 is a block diagram of a non-volatile memory device according to some embodiments. Referring to FIG. 8, the non-volatile memory device 120 may communicate with the storage controller 110 of FIG. 1. For example, the non-volatile memory device 120 may receive the command CMD and the address ADD from the storage controller 110. The non-volatile memory device 120 may perform data communication with the storage controller 110.

The non-volatile memory device 120 may include the control logic circuit 121, a voltage generating circuit 122, an address decoder (e.g., address decoder circuit) 123, a memory cell array 124, a page buffer (e.g., page buffer circuit) 125, and an input/output (I/O) circuit 126. The control logic circuit 121 may correspond to the control logic circuit 121 of FIG. 1.

The control logic circuit 121 may receive the command CMD and the address ADD. The command CMD may be a signal indicating an operation to be performed in the non-volatile memory device 120. For example, the command CMD may indicate the operations described with reference to FIG. 3. The address ADD may include a row address and a column address describing a location of data corresponding to the command CMD. In some embodiments, the address ADD may include offset information for adjusting a read voltage level. The control logic circuit 121 may control all the operations of the non-volatile memory device 120 based on the command CMD and the address ADD.

Under control of the control logic circuit 121, the voltage generating circuit 122 may control voltages to be applied to the memory cell array 124 through the address decoder 123. In some embodiments, based on the offset information recorded at the address ADD, the control logic circuit 121 may adjust a read voltage level which the voltage generating circuit 122 applies to the memory cell array 124 through the address decoder 123.

The address decoder 123 may receive the row address and the column address from the control logic circuit 121. The address decoder 123 may decode the row address and the column address. The address decoder 123 may receive the voltages from the voltage generating circuit 122. The address decoder 123 may be connected to the memory cell array 124 through string selection lines SSL, word lines WL, and ground selection lines GSL. The address decoder 123 may control voltages to be applied to the string selection lines SSL, the word lines WL, and the ground selection lines GSL based on a decoding result and the voltages received from the voltage generating circuit 122.

The memory cell array 124 may include the plurality of memory planes MP. Each of the plurality of memory planes MP may include a plurality of memory cells arranged in a row direction and a column direction. The memory cells may store data. For example, each of the memory cells may be implemented with a single level cell storing one bit or may be implemented with a multi-level cell storing two or more bits.

The page buffer 125 may be connected to the memory cell array 124 through bit lines BL. The page buffer 125 may read data from the memory cell array 124 by sensing voltages of the bit lines BL under control of the control logic circuit 121. The I/O circuit 126 may receive data from the page buffer 125 through data lines DL. The I/O circuit 126 may provide the received data to the storage controller 110 of FIG. 1.

The I/O circuit 126 may receive data from the storage controller 110 of FIG. 1. The I/O circuit 126 may provide the received data to the page buffer 125 through the data lines DL. The control logic circuit 121 may store data in the memory cell array 124 by controlling the voltage generating circuit 122 and the address decoder 123 by referring to the data stored in the page buffer 125.

Figure 9:
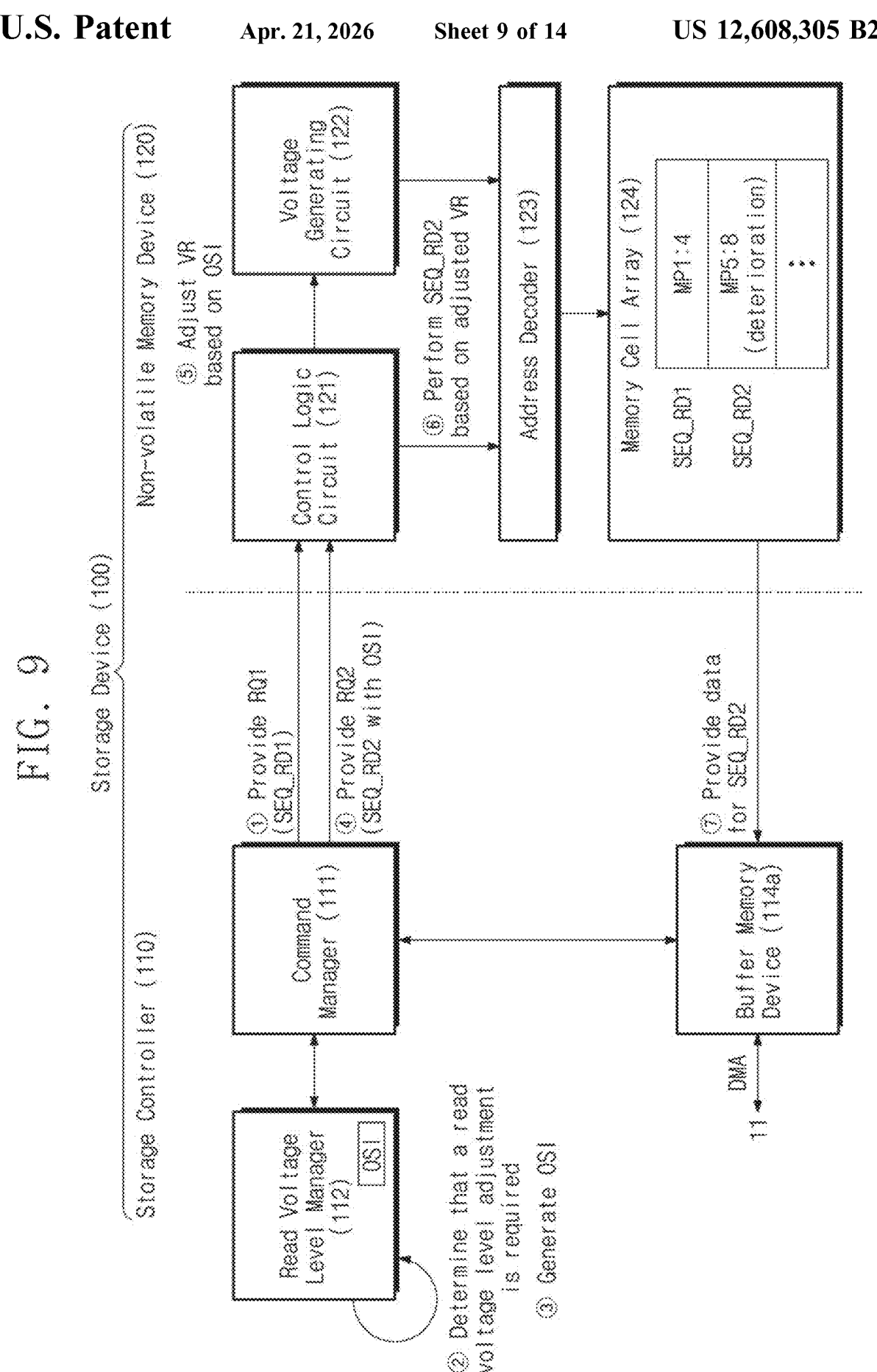
FIG. 9 is a flowchart describing a method of operating a storage device, according to some embodiments.

FIG. 9 is a flowchart describing a method of operating a storage device, according to some embodiments. Referring to FIG. 9, the storage device 100 may include the storage controller 110 and the non-volatile memory device 120. The storage controller 110 may communicate with the host device 11, which may be outside (i.e., external to) the storage device 100.

The storage controller 110 may include the command manager 111, the read voltage level manager 112, and the buffer memory device 114a. The command manager 111 may support the sequential read operation. The read voltage level manager 112 may perform the status check operation of the non-volatile memory device 120 and then, may obtain distribution information. The buffer memory device 114a may communicate with the non-volatile memory device 120 and the host device 11. The buffer memory device 114a and the host device 11 may support direct memory access (DMA) communication.

The non-volatile memory device 120 may include the control logic circuit 121, the voltage generating circuit 122, the address decoder 123, and the memory cell array 124. The control logic circuit 121 may receive a request including a command and an address from the command manager 111, and may control the voltage generating circuit 122 and the address decoder 123 depending on the received request. The voltage generating circuit 122 may provide a voltage to the address decoder 123 under control of the control logic circuit 121. Under control of the control logic circuit 121, the address decoder 123 may provide the memory cell array 124 with the voltage received from the voltage generating circuit 122. The memory cell array 124 may include first to eighth memory planes MP1 to MP8. The memory cell array 124 may provide the stored data to the buffer memory device 114a, based on the voltage received from the address decoder 123.

Below, a method of operating the storage device 100 will be described.

In a first operation ①, the storage controller 110 may provide the control logic circuit 121 with a first request RQ1 for a first sequential read operation SEQ_RD1 of first data. The first data may include first to fourth segments sequentially. The first to fourth memory planes MP1 to MP4 of the memory cell array 124 may respectively store the first to fourth segments of the first data. The first sequential read operation SEQ_RD1 may be the operation of the second type TY2 of FIG. 3. The control logic circuit 121 may perform the first sequential read operation SEQ_RD1 based on the first request RQ1. The memory cell array 124 may provide the data stored in the first to fourth memory planes MP1 to MP4 to the buffer memory device 114a. The buffer memory device 114a may sequentially provide the first to fourth segments of the first data to the host device 11.

In a second operation ②, the read voltage level manager 112 may perform the status check operation to obtain distribution information. The distribution information may indicate that the fifth to eighth memory planes MP5 to MP8 have deteriorated. The read voltage level manager 112 may determine that read voltage level adjustment of second data stored to be sequential to the first data is required, by referring to the obtained distribution information. The second data may include fifth to eighth segments sequentially. The fifth to eighth memory planes MP5 to MP8 of the memory cell array 124 may respectively store the fifth to eighth segments of the second data.

In a third operation ③, based on determining that read voltage level adjustment of the second data is required, the read voltage level manager 112 may generate the offset information OSI for adjusting a read voltage level VR of the second data based on the distribution information.

In some embodiments, the offset information OSI may include fifth to eighth plane offset information respectively corresponding to the fifth to eighth memory planes MP5 to MP8. The plane offset information may indicate a difference between a default read voltage level and an optimized read voltage level of a corresponding memory plane. The read voltage level manager 112 may provide the offset information OSI to the command manager 111.

In a fourth operation ④, the storage controller 110 may provide the control logic circuit 121 with a second request RQ2 for a second sequential read operation SEQ_RD2 of the second data stored to be sequential to the first data. The second request RQ2 may include the offset information OSI. The second request RQ2 may not indicate a row address and a column address of the second data. The second sequential read operation SEQ_RD2 may be the operation of the fourth type TY4 of FIG. 3.

In a fifth operation ⑤, based on the offset information OSI, the control logic circuit 121 may adjust the read voltage level VR of the second data, which the voltage generating circuit 122 provides to the memory cell array 124 through the address decoder 123.

In a sixth operation ⑥, the control logic circuit 121 may perform the second sequential read operation SEQ_RD2 of the second data by controlling the address decoder 123 based on the read voltage level VR adjusted by the voltage generating circuit 122.

In a seventh operation ⑦, the memory cell array 124 may provide data (i.e., the second data) associated with the second sequential read operation SEQ_RD2 to the buffer memory device 114a, based on the adjusted read voltage level VR received through the address decoder 123.

In detail, the fifth to eighth memory planes MP5 to MP8 of the memory cell array 124 may sequentially provide the buffer memory device 114a with the fifth to eighth segments of the second data obtained by using the fifth to eighth plane offset information of the offset information OSI. The buffer memory device 114a may temporarily store the fifth to eighth segments of the second data. The buffer memory device 114a may sequentially provide the fifth to eighth segments of the second data to the host device 11.

In some embodiments, based on the DMA communication, the buffer memory device 114a may provide the host device 11 with the data received from the non-volatile memory device 120.

Figure 10:
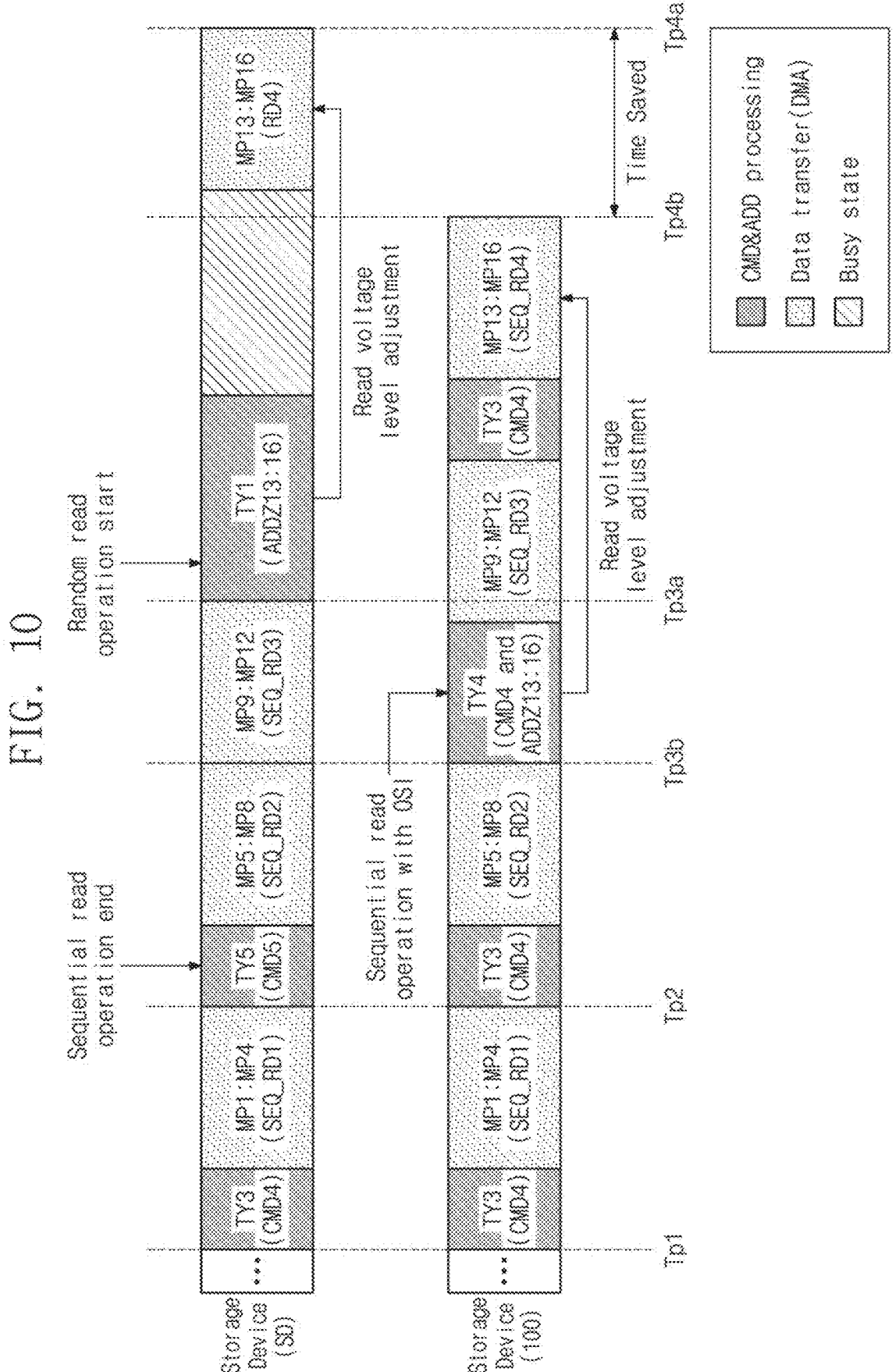
FIG. 10 is a diagram describing operation states of a storage device, according to some embodiments.

FIG. 10 is a diagram describing operation states of a storage device, according to some embodiments. A timing diagram describing operation states of the related storage device SD and a timing diagram describing operation states of the storage device 100 will be described with reference to FIG. 10. In FIG. 10, the horizontal axis represents a time. Dark shading indicates a state of processing a command and an address. Light shading indicates a state of performing data transmission (e.g., DMA communication). Diagonal shading indicates a busy state due to any other internal operation or the like.

Referring to the timing diagram of the related storage device SD, at a first point in time Tp1, the related storage device SD may perform the operation of the third type TY3. The operation of the third type TY3 may be performed based on the fourth command CMD4. Afterwards, the related storage device SD may provide the host device with the data of the first to fourth memory planes MP1 to MP4 obtained by the first sequential read operation SEQ_RD1.

At a second point in time Tp2, the related storage device SD may determine that read voltage level adjustment for thirteenth to sixteenth memory planes MP13 to MP16 is required. Because the related storage device SD does not support the operation of the fourth type TY4, the operation of the first type TY1 may be used to adjust a read voltage level. The related storage device SD may perform the operation of the fifth type TY5 to terminate the sequential read operation. The operation of the fifth type TY5 may be performed according to a fifth command CMD5.

Afterwards, the related storage device SD may provide the host device with the data of the fifth to eighth memory planes MP5 to MP8 obtained by the second sequential read operation SEQ_RD2. The second sequential read operation SEQ_RD2 may be based on the operation of the third type TY3 performed at the first point in time Tp1.

Afterwards, the related storage device SD may provide the host device with the data of the ninth to twelfth memory planes MP9 to MP12 obtained by a third sequential read operation SEQ_RD3. The third sequential read operation SEQ_RD3 may be based on the operation of the fifth type TY5 performed at the second point in time Tp2.

At a third point in time Tp3a, the related storage device SD may perform the operation of the first type TY1. The operation of the first type TY1 may be performed based on an indication of a row address and a column address of the thirteenth to sixteenth memory planes MP13 to MP16, commands for the random read operation, and offset information for adjusting read voltage levels of the thirteenth to sixteenth memory planes MP13 to MP16. The offset information may be recorded at thirteenth to sixteenth addresses ADDZ13 to ADDZ16.

Afterwards, the related storage device SD may enter the busy state to prepare the operation of the first type TY1. After the busy state ends, the related storage device SD may provide the host device with the data of the thirteenth to sixteenth memory planes MP13 to MP16 obtained by a fourth read operation RD4 using the adjusted read voltage levels. The fourth read operation RD4 may be based on the operation of the first type TY1 performed at the third point in time Tp3a.

At a fourth point in time Tp4a, the read operation of the first to sixteenth memory planes MP1 to MP16 of the related storage device SD may be completed.

Referring to the timing diagram of the storage device 100, at the first point in time Tp1, the storage device 100 may perform the operation of the third type TY3. The operation of the third type TY3 may be performed based on the fourth command CMD4. The storage device 100 may provide the host device with the data of the first to fourth memory planes MP1 to MP4 obtained by the first sequential read operation SEQ_RD1.

At the second point in time Tp2, the storage device 100 may determine that read voltage level adjustment for the thirteenth to sixteenth memory planes MP13 to MP16 is required. Unlike the case of the related storage device SD, because the storage device 100 supports the operation of the fourth type TY4, the storage device 100 does not need to terminate the sequential read operation to adjust a read voltage level.

The storage device 100 may perform the operation of the third type TY3. The operation of the third type TY3 may be performed based on the fourth command CMD4. The storage device 100 may provide the host device with the data of the fifth to eighth memory planes MP5 to MP8 obtained by the second sequential read operation SEQ_RD2. The second sequential read operation SEQ_RD2 may be based on the operation of the third type TY3 performed at the first point in time Tp1.

At a third point in time Tp3b, the storage device 100 may perform the operation of the fourth type TY4. The operation of the fourth type TY4 may be performed based on the fourth command CMD4, and offset information for adjusting read voltage levels of the thirteenth to sixteenth memory planes MP13 to MP16. The offset information may be recorded at the thirteenth to sixteenth addresses ADDZ13 to ADDZ16.

The storage device 100 may provide the host device with the data of the ninth to twelfth memory planes MP9 to MP12 obtained by the third sequential read operation SEQ_RD3. The third sequential read operation SEQ_RD3 may be based on the operation of the third type TY3 performed at the second point in time Tp2.

The storage device 100 may perform the operation of the third type TY3. The operation of the third type TY3 may be performed based on the fourth command CMD4. The storage device 100 may provide the host device with the data of the thirteenth to sixteenth memory planes MP13 to MP16 obtained by a fourth sequential read operation SEQ_RD4 using the adjusted read voltage levels. The fourth sequential read operation SEQ_RD4 may be based on the operation of the fourth type TY4 performed at the third point in time Tp3*b*.

At a fourth point in time Tp4*b*, the read operation of the first to sixteenth memory planes MP1 to MP16 of the storage device 100 may be completed.

As described above, the fourth point in time Tp4*b* of the storage device 100 may be faster than a fourth point in time Tp4*a* of the related storage device SD. When read voltage level adjustment is required, a time required to perform the read operation may be reduced by adjusting a read voltage level while maintaining the sequential read operation, instead of terminating the sequential read operation and performing the random read operation to adjust the read voltage level.

Figure 11:
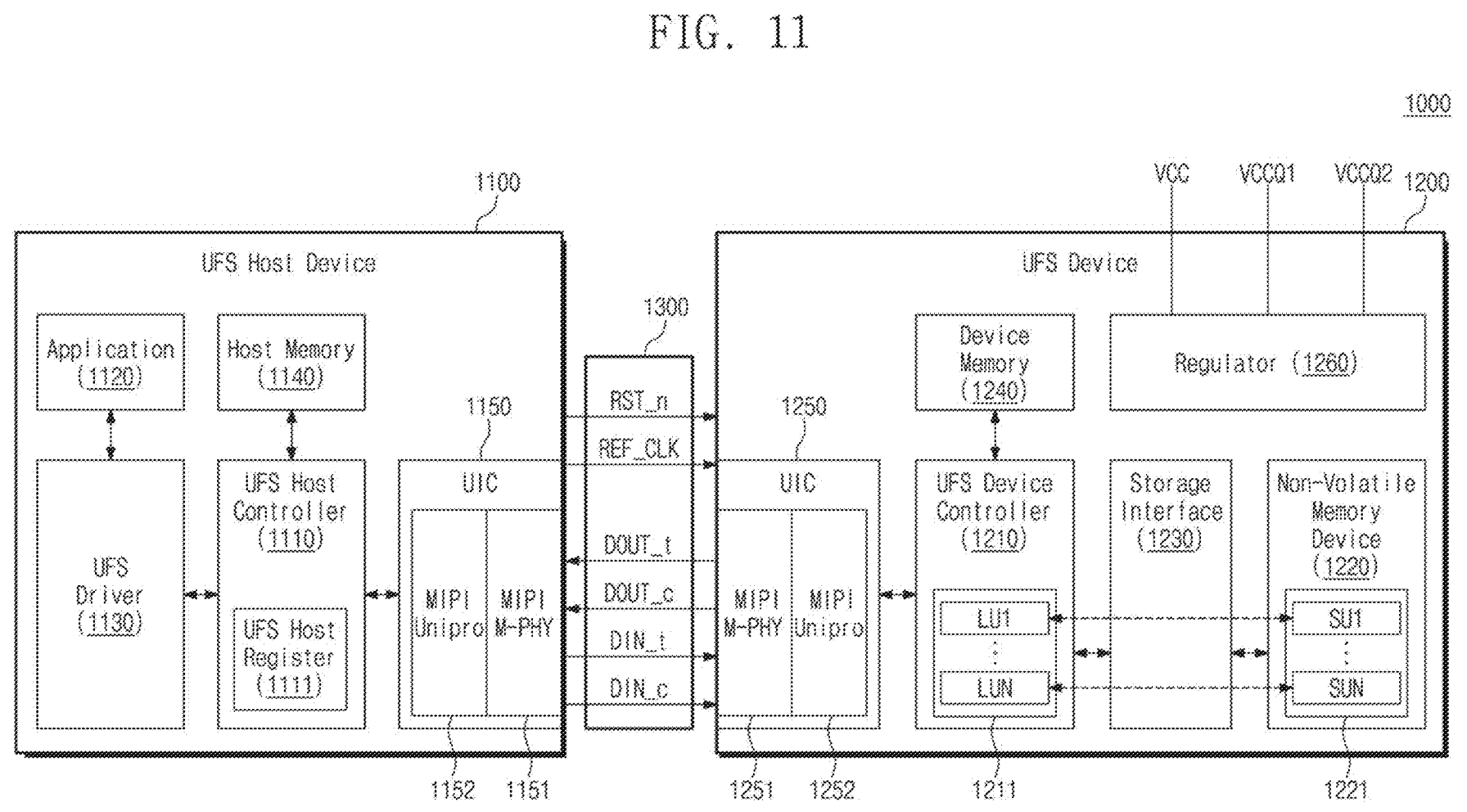

FIG. 11 is a block diagram of an electronic device according to some embodiments. Referring to FIG. 11, the electronic device 1000 may be implemented as a UFS system. The UFS system may be a system that follows the UFS standard published by the Joint Electron Device Engineering Council (JEDEC). The electronic device 1000 may include a UFS host device 1100, a UFS device 1200, and a UFS interface 1300.

The electronic device 1000 may correspond to the electronic device 10 of FIG. 1. The UFS device 1200 may correspond to the storage device 100 of FIGS. 1, 6, and 9.

The UFS host device 1100 and the UFS device 1200 may be interconnected through the UFS interface 1300. The UFS host device 1100 may include a UFS host controller 1110, an application 1120, a UFS driver 1130, a host memory 1140, and a UFS interconnect (UIC) layer 1150.

The UFS device 1200 may include a UFS device controller 1210, non-volatile memory device 1220, storage interface 1230, device memory 1240, UIC layer 1250, and regulator 1260. The non-volatile memory device 1220 may be composed of a plurality of storage devices 1221. The UFS device controller 1210 and the non-volatile memory device 1220 may be connected to each other through a storage interface 1230. The storage interface 1230 may comply with standard protocols such as Toggle or ONFI.

The application 1120 may refer to software that communicates with UFS device 1200 to utilize the functionality of UFS device 1200. The application 1120 may transmit an input/output request (IOR) to the UFS driver 1130 for input/output to the UFS device 1200. An input/output request (IOR) may mean a read request, write request, and/or erase request of data, but is not necessarily limited thereto.

The UFS driver 1130 may manage the UFS host controller 1110 through UFS-HCI (host controller interface). The UFS driver 1130 may convert the input/output request generated by the application 1120 into a UFS command defined by the UFS standard and transmit the converted UFS command to the UFS host controller 1110. One input/output request may be converted into multiple UFS commands. UFS commands may be commands defined by the SCSI standard, but may also be commands exclusive to the UFS standard.

The UFS host controller 1110 may transmit the UFS command converted by the UFS driver 1130 to the UIC layer 1250 of the UFS device 1200 through the UIC layer 1150 and the UFS interface 1300. In this process, the UFS host register 1111 of the UFS host controller 1110 may function as a command queue (CQ).

The UIC layer 1150 on the UFS host device 1100 side may include MIPI M-PHY 1151 and MIPI UniPro 1152. Similarly, the UIC layer 1250 on the UFS device 1200 side may include MIPI M-PHY 1251 and MIPI UniPro 1252.

The UFS interface 1300 includes a line transmitting a reference clock REF_CLK, a line transmitting a hardware reset signal RST_n for the UFS device 1200, a pair of lines transmitting a pair of differential input signals DIN_t and DIN_c, and a pair of lines transmitting a pair of differential output signals DOUT_t and DOUT_c.

The frequency value of the reference clock REF_CLK provided from the UFS host device 1100 to the UFS device 1200 may be one of four values: 19.2 MHZ, 26 MHZ, 38.4 MHz, and 52 MHz, but example embodiments are not limited thereto. The UFS host device 1100 may change the frequency value of the reference clock REF_CLK even during operation. The value of the data rate between the UFS host device 1100 and the UFS device 1200 may be determined depending on the frequency value of the reference clock REF_CLK.

The UFS interface 1300 may support multiple lanes. Each of the plurality of lanes may be implemented as a differential pair. For example, a pair of lines receiving a differential input signal pair DIN_t and DIN_c may constitute a receiving lane. A pair of lines transmitting a pair of differential output signals DOUT_t and DOUT_c may constitute a transmitting lane. The number of receiving lanes and the number of transmitting lanes between the UFS host device 1100 and the UFS device 1200 may vary.

The receiving lane and the transmitting lane may transmit data through serial communication. Since the receiving lane and the transmitting lane are separated, the UFS host device 1100 and the UFS device 1200 may communicate in a full-duplex manner. For example, while the UFS device 1200 receives data from the UFS host device 1100 through a receiving lane, it may transmit data to the UFS host device 1100 through a transmitting lane.

The UFS device controller 1210 may control overall operations of the UFS device 1200. The UFS device controller 1210 may manage a plurality of storage devices 1221 of the non-volatile memory device 1220 through a plurality of logical units 1211. UFS device controller 1210 may include a flash translation layer (FTL) and may support logical-to-physical (L2P) mapping.

The UFS device controller 1210 may correspond to the storage controller 110 of FIGS. 1, 6, 7, and 9.

The non-volatile memory device 1220 may include a plurality of storage devices 1221. The storage device may include a memory cell array and a logic circuit controlling the memory cell array. The memory cell array may include a plurality of memory cells.

The non-volatile memory device 1220 may correspond to the non-volatile memory device 120 of FIGS. 1, 6, 8, and 9.

The UFS device 1200 may receive power voltages VCC, VCCQ1, and VCCQ2. The power supply voltage VCC may be the main power supply voltage for the UFS device 1200. The power supply voltage VCCQ1 may be a power supply voltage for supplying a low range voltage. The power supply voltage VCCQ2 may be a power supply voltage that is lower than the power supply voltage VCC and higher than the power supply voltage VCCQ1, and may be used to drive the MIPI M-PHY 1251. The regulator 1260 may provide corresponding voltages to components of the UFS device 1200 based on the power supply voltages VCC, VCCQ1, and VCCQ2.

Figure 12:
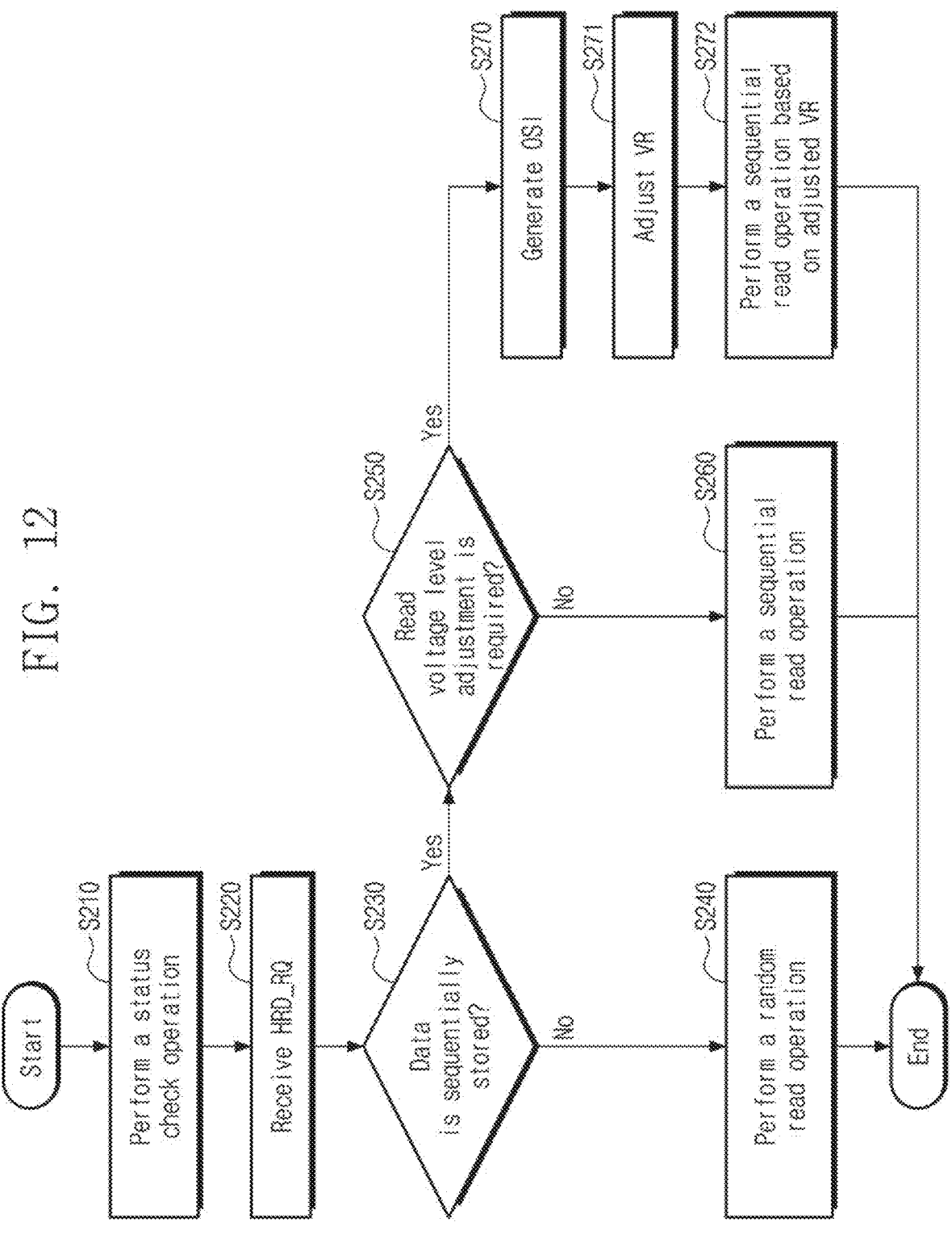
FIG. 12 is a flowchart describing a method of operating a storage device, according to some embodiments.

FIG. 12 is a flowchart describing a method of operating a storage device, according to some embodiments. Referring to FIG. 12, a storage device may communicate with a host device. The storage device may correspond to the storage device 100 described with reference to FIGS. 1, 6, and 9 or may correspond to the UFS device 1200 described with reference to FIG. 11.

In operation S210, the storage device may perform the status check operation. For example, the storage device may include a storage controller and a non-volatile memory device. The storage controller may perform the status check operation of the non-volatile memory device to obtain distribution information of data stored in the non-volatile memory device. The distribution information may indicate the tendency of threshold voltage distributions corresponding to the data stored in the memory cells of the non-volatile memory device. Operation S210 may be further performed to update the distribution information at an arbitrary time point while the storage device operates.

In operation S220, the storage device may receive a host read request HRD_RQ from the host device. The host read request HRD_RQ may indicate the read operation of a plurality of data stored in the storage device.

In operation S230, the storage device may determine whether the plurality of data corresponding to the host read request HRD_RQ are sequentially stored. When the plurality of data are not sequentially stored, the storage device may perform operation S240.

In operation S240, the storage device may perform the random read operation on the plurality of data which are determined as being not stored sequentially.

Returning to operation S230, when the storage device determines that the plurality of data corresponding to the host read request HRD_RQ are sequentially stored, the storage device may perform operation S250.

In operation S250, the storage device may determine whether read voltage level adjustment is required, based on the distribution information obtained by the status check operation in operation S210. When it is determined that the read voltage level adjustment is not required, the storage device may perform operation S260.

In operation S260, the storage device may perform the sequential read operation. In this case, the sequential read operation may be based on the default read voltage level of the initial state. In some embodiments, the storage device may perform the sequential read initiation operation before operation S260 and may perform the sequential read termination operation after operation S260.

Returning to operation S250, when the storage device determines that the read voltage level adjustment is required based on the distribution information, the storage device may perform operation S270.

In operation S270, the storage device may generate the offset information OSI, based on the distribution information obtained by the status check operation in operation S210. The offset information OSI may indicate a difference between the default read voltage level of the initial state and an optimized read voltage level at a point in time when the status check operation is performed in operation S210. The offset information OSI may be provided to the non-volatile memory device of the storage device.

In operation S271, the non-volatile memory device of the storage device may adjust the read voltage level VR based on the offset information OSI. For example, the non-volatile memory device may set the read voltage level VR to the optimized read voltage level, based on the default read voltage level stored as a default value and the offset information OSI generated in operation S270. The optimized read voltage level may be also referred to as an "adjusted read voltage level VR".

In operation S272, the storage device may perform the sequential read operation based on the adjusted read voltage level VR. In this case, the sequential read operation may be based on the adjusted read voltage level VR different from the default read voltage level. In some embodiments, the storage device may perform the sequential read initiation operation before operation S272 and may perform the sequential read termination operation after operation S272.

Figure 13:
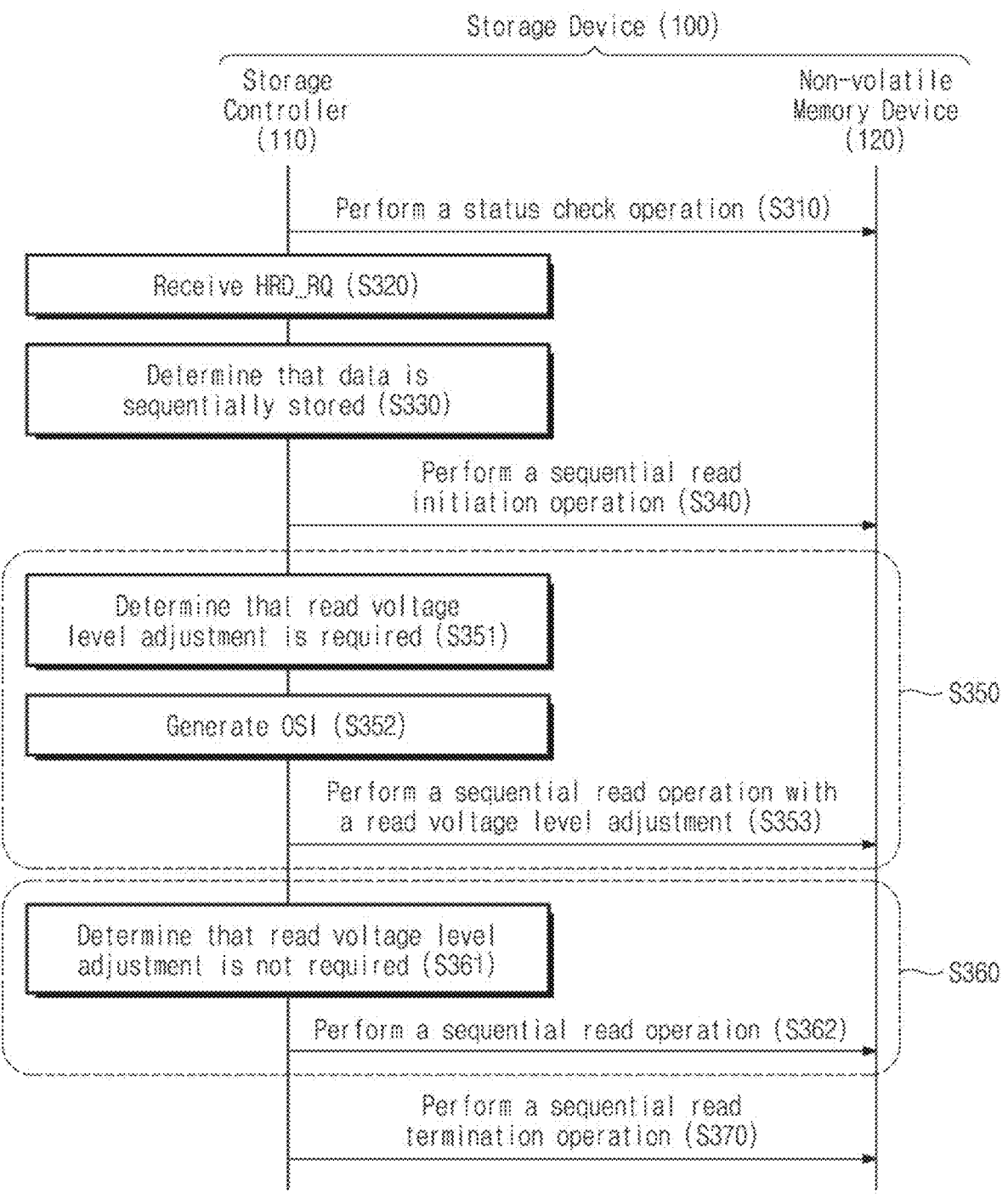
FIG. 13 is a flowchart describing a method of operating a storage device, according to some embodiments.

FIG. 13 is a flowchart describing a method of operating a storage device, according to some embodiments. Referring to FIG. 13, the storage device 100 may communicate with a host device. The storage device 100 may include the storage controller 110 and the non-volatile memory device 120. The storage device 100 may correspond to the storage device 100 described with reference to FIGS. 1, 6, and 9 or may correspond to the UFS device 1200 described with reference to FIG. 11.

In operation S310, the storage controller 110 may perform the status check operation to obtain distribution information of data stored in the non-volatile memory device 120.

In operation S320, the storage controller 110 may receive the host read request HRD_RQ from the host device. The host read request HRD_RQ may indicate the read operation of a plurality of data stored in the non-volatile memory device 120.

In operation S330, the storage controller 110 may determine that the plurality of data corresponding to the host read request HRD_RQ are sequentially stored in the non-volatile memory device 120. For example, the plurality of data may include first data, second data, third data, and fourth data sequentially.

In operation S340, the storage controller 110 may perform the sequential read initiation operation of the first data. The first data may be data stored first of all from among a plurality of data sequentially stored. The storage controller 110 may provide a row address and a column address of the first data to the non-volatile memory device 120.

In operation S350, the storage device 100 may perform the sequential read operation of the second data sequential to the first data by using the adjusted read voltage level. Operation S350 may include operation S351, operation S352, and operation S353.

In operation S351, the storage controller 110 may determine that read voltage level adjustment of the second data is required, based on the distribution information.

In operation S352, the storage controller 110 may generate the offset information OSI based on the distribution information. The offset information OSI may indicate a difference between the default read voltage level of the initial state and an optimized read voltage level of the second data.

In operation S353, the storage controller 110 may perform the sequential read operation with read voltage level adjustment. The storage controller 110 may provide the offset information OSI to the non-volatile memory device 120. The storage controller 110 may not provide a row address and a column address of the second data to the non-volatile memory device 120. The non-volatile memory device 120 may identify the second data based on the sequentiality of the first data and the second data. The non-volatile memory device 120 may obtain an optimized read voltage level by using the offset information OSI and may provide the second data to the storage controller 110 by using the optimized read voltage level.

In operation S360, the storage device 100 may perform the sequential read operation of the third data sequential to the second data by using the default read voltage level. Operation S360 may include operation S361 and operation S362.

In operation S361, the storage controller 110 may determine that read voltage level adjustment of the third data is not required, based on the distribution information.

In operation S362, the storage controller 110 may perform the sequential read operation. The storage controller 110 may not provide a row address and a column address of the third data to the non-volatile memory device 120. The non-volatile memory device 120 may identify the third data based on the sequentiality of the second data and the third data. The non-volatile memory device 120 may provide the third data to the storage controller 110 by using the default read voltage level.

In operation S370, the storage controller 110 may perform the sequential read termination operation after reading fourth data sequential to the third data. The fourth data may be data stored last from among a plurality of data sequentially stored. The storage controller 110 may not provide a row address and a column address of the fourth data to the non-volatile memory device 120. The non-volatile memory device 120 may identify the fourth data based on the sequentiality of the third data and the fourth data. The non-volatile memory device 120 may provide the fourth data to the storage controller 110.

In some embodiments, operation S350 and operation S360 may be variously repeated between operation S340 and operation S370 in various orders. For example, operation S350 may be repeatedly performed between operation S340 and operation S370. Operation S360 may be repeatedly performed between operation S340 and operation S370. Alternatively, operation S360 may be performed prior to operation S350.

Figure 14:
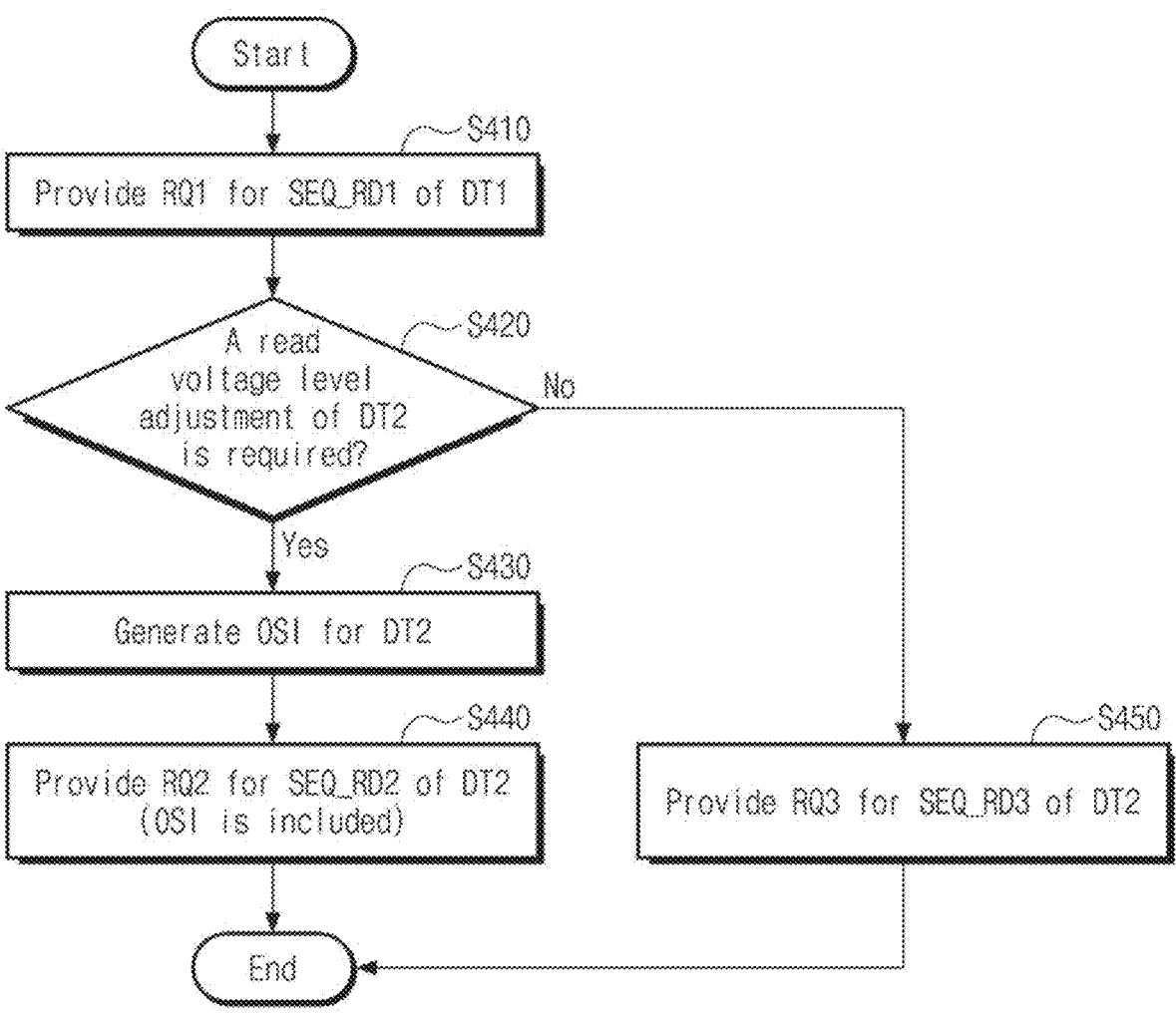
FIG. 14 is a flowchart describing a method of operating a storage controller, according to some embodiments.

FIG. 14 is a flowchart describing a method of operating a storage controller, according to some embodiments. Referring to FIG. 14, a storage controller may communicate with a non-volatile memory device. The storage controller may correspond to the storage controller 110 described with reference to FIGS. 1, 6, 7, and 9 or may correspond to the UFS controller 1210 described with reference to FIG. 11.

In operation S410, the storage controller may provide the non-volatile memory device with the first request RQ1 for the first sequential read operation SEQ_RD1 of first data DT1. The first request RQ1 may indicate a row address and a column address of the first data DT1. The non-volatile memory device may sequentially store the first data DT1 and second data DT2.

In operation S420, the storage controller may determine whether there is required read voltage level adjustment of the second data DT2 stored in the non-volatile memory device to be sequential to the first data DT1. For example, before performing operation S420, the storage controller may perform the status check operation of the non-volatile memory device to obtain distribution information of the second data DT2. The storage controller may determine whether the read voltage level adjustment of the second data DT2 is required, based on the distribution information of the second data DT2. When it is determined that the read voltage level adjustment of the second data DT2 is required, the storage controller may perform operation S430.

In operation S430, the storage controller may generate the offset information OSI. For example, the storage controller may generate the offset information OSI based on the distribution information of the second data DT2. The offset information OSI may indicate a difference between the default read voltage level of the initial state and an optimized read voltage level at a point in time when the status check operation is performed. The offset information OSI may be used for a read operation based on of the second data DT2.

In operation S440, the storage controller may provide the non-volatile memory device with the second request RQ2 for the second sequential read operation SEQ_RD2 of the second data DT2. The second request RQ2 may include the offset information OSI. For example, the offset information OSI may be recorded as address information of the second request RQ2. The second request RQ2 may include a command indicating the sequentiality of the first data DT1 and the second data DT2. The second request RQ2 may not indicate a row address and a column address of the second data DT2.

The non-volatile memory device may receive the second request RQ2, may obtain an optimized read voltage level based on the offset information OSI, and may provide the second data DT2 to the storage controller based on the optimized read voltage level. The optimized read voltage level may be also referred to as an "adjusted read voltage level". The storage controller may receive the second data DT2 from the non-volatile memory device.

In some embodiments, the offset information OSI may reduce an error level of data. For example, while the non-volatile memory device processes the second sequential read operation SEQ_RD2 based on the second request RQ2, the number of error bits obtained by reading the second data DT2 stored in the non-volatile memory device by using the offset information OSI may be less than the number of error bits obtained by reading the second data DT2 stored in the non-volatile memory device by using the default read voltage level of the initial state.

Returning to operation S420, when the storage device determines that the read voltage level adjustment of the second data DT2 is not required, the storage controller may perform operation S450.

In operation S450, the storage controller may provide the non-volatile memory device with a third request RQ3 for the third sequential read operation SEQ_RD3 of the second data DT2. The third request RQ3 may include a command indicating the sequentiality of the first data DT1 and the second data DT2. The third request RQ3 may not indicate a row address and a column address of the second data DT2.

The non-volatile memory device may receive the third request RQ3 and may provide the second data DT2 to the storage controller based on the default read voltage level. The storage controller may receive the second data DT2 from the non-volatile memory device.

According to an embodiment, a storage controller which adjusts a read voltage level, a storage device including the same, and a method of operating the same are provided.

Also, a read voltage level may be adjusted while maintaining a sequential read operation, instead of terminating the sequential read operation and performing a random read operation to adjust a read voltage level. Accordingly, the overhead of command management may decrease, a time required to perform the read operation may decrease, and the reliability of stored data may be maintained.

While aspects of embodiments have been described, it will be apparent to those of ordinary skill in the art that various changes and modifications may be made thereto without departing from the spirit and scope as set forth in the following claims.

What is claimed is:

1. A method of operating a storage controller which communicates with a non-volatile memory device, the method comprising:

providing a first request to the non-volatile memory device for a first sequential read operation of first data, wherein the first request indicates a row address and a column address of the first data;

determining to adjust a read voltage level for reading second data stored sequential to the first data;

generating offset information for adjusting the read voltage level; and providing a second request to the non-volatile memory device for a second sequential read operation of the second data to the non-volatile memory device, wherein the second request indicates the offset information and sequentiality of the first data and the second data, and controls the non-volatile memory device to adjust the read voltage level while maintaining a sequential read operation.

2. The method of claim 1, wherein the second request does not indicate a row address and a column address of the second data.

3. The method of claim 1, wherein the offset information is recorded as address information of the second request.

4. The method of claim 1, further comprising performing a status check operation of the non-volatile memory device to obtain distribution information of the second data, wherein the generating of the offset information comprises generating the offset information based on the distribution information.

5. The method of claim 4, wherein the offset information indicated by the second request indicates a difference between a default read voltage level of an initial state and an optimized read voltage level.

6. The method of claim 1, further comprising receiving the second data from the non-volatile memory device based on the offset information indicated by the second request, wherein a number of error bits obtained by reading the second data of the non-volatile memory device by using the offset information is less than a number of error bits obtained by reading the second data of the non-volatile memory device by using a default read voltage level of an initial state.

7. The method of claim 6, wherein the non-volatile memory device includes a first memory plane, a second memory plane, a third memory plane, and a fourth memory plane disposed sequentially, wherein the second data include a first segment, a second segment, a third segment, and a fourth segment, wherein the first to fourth memory planes respectively store the first to fourth segments, and wherein the receiving the second data comprises:

sequentially receiving the first to fourth segments of the second data from the first to fourth memory planes based on the offset information indicated by the second request; and sequentially providing the first to fourth segments of the second data to a host device.

8. The method of claim 7, wherein the offset information indicated by the second request comprises:

first plane offset information indicating a difference between the default read voltage level of the initial state and a first optimized read voltage level corresponding to the first memory plane;

second plane offset information indicating a difference between the default read voltage level and a second optimized read voltage level corresponding to the second memory plane;

third plane offset information indicating a difference between the default read voltage level and a third optimized read voltage level corresponding to the third memory plane; and fourth plane offset information indicating a difference between the default read voltage level and a fourth optimized read voltage level corresponding to the fourth memory plane.

9. The method of claim 6, further comprising:

providing the second data to a host device, based on direct memory access (DMA) communication.

10. The method of claim 1, further comprising:

providing a third request to the non-volatile memory device for a third sequential read operation of third data based on determining adjustment of the read voltage level is not required for reading the third data; and receiving the third data obtained by using a default read voltage level of an initial state from the non-volatile memory device.

11. The method of claim 1, further comprising:

determining whether to adjust the read voltage level for reading third data stored sequential to the second data;

generating additional offset information for adjusting the read voltage level;

providing a third request to the non-volatile memory device for a third sequential read operation of the third data, wherein the third request indicates the additional offset information; and receiving the third data obtained by using the additional offset information from the non-volatile memory device.

12. The method of claim 1, further comprising:

determining whether to adjust the read voltage level for reading third data stored sequential to the second data;

providing a third request to the non-volatile memory device for a third sequential read operation of the third data, based on adjustment of the read voltage level not being required; and receiving the third data obtained by using a default read voltage level of an initial state from the non-volatile memory device.

13. The method of claim 1, further comprising, receiving a host read request for a plurality of sequential data comprising the first data and the second data, wherein the first data are data stored first among the plurality of sequential data, and wherein the first sequential read operation is a sequential read initiation operation.

14. The method of claim 1, further comprising:

receiving a host read request for a plurality of sequential data comprising the first data, the second data, and third data; and providing a third request to the non-volatile memory device based on the second request for a third sequential read operation of the third data, wherein the third data are data stored at an end of the plurality of sequential data, and wherein the third sequential read operation is a sequential read termination operation.

15. The method of claim 1, wherein the storage controller is implemented with a universal flash storage (UFS) device controller, and wherein the storage controller is configured to communicate with a host device by using an UFS interface.

16. A storage controller comprising:

a read voltage level management circuit configured to:

determine whether to adjust a read voltage level for reading second data, based on a status check operation of a non-volatile memory device sequentially storing first data and the second data; and generate offset information for adjusting the read voltage level based on a determination to adjust the read voltage level for reading the second data; and a command management circuit configured to:

provide a first request to the non-volatile memory device for a first sequential read operation of the first data;

receive the offset information from the read voltage level management circuit; and provide a second request to the non-volatile memory device for a second sequential read operation of the second data, wherein the first request indicates a row address and a column address of the first data, and wherein the second request indicates the offset information and sequentiality of the first data and the second data, and controls the non-volatile memory device to adjust the read voltage level while maintaining a sequential read operation.

17. The storage controller of claim 16, further comprising a buffer memory device configured to store the second data obtained by using the offset information from the non-volatile memory device, and to provide the second data to a host device based on direct memory access (DMA) communication.

18. A storage device comprising:

a non-volatile memory device configured to sequentially store first data and second data; and a storage controller comprising:

a read voltage level management circuit configured to:

determine whether to adjust a read voltage level for reading the second data, based on a status check operation of the non-volatile memory device; and generate offset information for adjusting the read voltage level based on a determination to adjust the read voltage level for reading the second data;

a command management circuit configured to:

provide a first request to the non-volatile memory device for a first sequential read operation of the first data;

receive the offset information from the read voltage level management circuit; and provide a second request to the non-volatile memory device for a second sequential read operation of the second data; and a buffer memory device configured to receive the first data and the second data from the non-volatile memory device, wherein the first request indicates a row address and a column address of the first data, and wherein the second request indicates the offset information and sequentiality of the first data and the second data, and controls the non-volatile memory device to adjust the read voltage level while maintaining a sequential read operation.

19. The storage device of claim 18, wherein the non-volatile memory device comprises:

a memory cell array configured to store the first data and the second data;

a voltage generating circuit electrically connected to the memory cell array; and a control logic circuit configured to provide the second data stored in the memory cell array to the buffer memory device by obtaining an adjusted read voltage level based on the offset information and controlling the second sequential read operation of the second data based on the adjusted read voltage level.

20. The storage device of claim 18, wherein the offset information indicates a difference between a default read voltage level of an initial state and an optimized read voltage level at a point in time when the status check operation is performed.

* * * * *